(12) United States Patent
Brcka

(10) Patent No.: US 6,237,526 B1
(45) Date of Patent: May 29, 2001

(54) PROCESS APPARATUS AND METHOD FOR IMPROVING PLASMA DISTRIBUTION AND PERFORMANCE IN AN INDUCTIVELY COUPLED PLASMA

(75) Inventor: Jozef Brcka, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/277,526

(22) Filed: Mar. 26, 1999

(51) Int. Cl.$^7$ ............................... C23C 16/00; H01J 7/24
(52) U.S. Cl. ................................. 118/723 I; 118/723 AN; 118/723 IR; 315/111.21; 315/111.51
(58) Field of Search .......................... 118/723 I, 727 AN, 118/723 IR, 723 E; 204/298.01, 298.02; 315/111.21, 111.51

(56) References Cited

U.S. PATENT DOCUMENTS

| 4,431,901 | 2/1984 | Hull . |
| 4,844,775 | 7/1989 | Keeble . |

(List continued on next page.)

FOREIGN PATENT DOCUMENTS

| 593924 A1 | 4/1994 | (DE) . | |
| 0 553 704 A1 | 1/1993 | (EP) . | |
| 0756309 | 1/1997 | (EP) . | |
| 782172 A2 | 7/1997 | (EP) . | |
| 0 813 227 A2 | 12/1997 | (EP) . | |
| 0820086 | 1/1998 | (EP) . | |
| 0836843 | 4/1998 | (EP) . | |
| 836 218 A2 | 4/1998 | (EP) . | |
| 838834 A2 * | 4/1998 | (EP) | ............................... H01J/37/32 |
| 0840350 | 5/1998 | (EP) . | |
| 86-261934 | 2/1985 | (JP) . | |
| WO 00/36632 | 12/1999 | (WO) . | |

OTHER PUBLICATIONS

DDickson, M., Qian, F., and Hopwood, J., Quenching of electron temperature and electron density in ionized physical vapor deposition, J. Vac. Sci. Technol. A 15(2) Mar./Apr. 1997.

Ding, Jian, New high density plasma dielectric etch process technology, The 4th Int'l Workshop on Advanced Plasma Tools and Process Engineering, May 26–27, 1998, Millbrae, CA, pp. 55–56.

Fukasawa, T, Nouda, T et al., RF Self–bias characteristics in inductively coupled plasma, Jpn. J. Appl. Phys. vol. 32 (1993) pp. 6076–6079.

Hopwood, J. and Qian, F., Mechanisms for highly ionized magnetron sputtering, J. Appl. Phys. 78(2) Jul. 1995.

Khater, Marwan H., Overzet, L.J. and Cherrington, B.E., Etch uniformity Optimization in low pressure inductively coupled plasmas: source design and gas distribution effects, 4th Int'l Workshop on Advanced Plasma Tools and Process Engineering, May 26–27, 1998, Millbrae, CA, p. 97.

Primary Examiner—Gregory Mills
Assistant Examiner—Parviz Hassanzadeh
(74) Attorney, Agent, or Firm—Wood, Herron & Evans LLP

(57) ABSTRACT

A processing system for processing a substrate with a plasma comprises a processing chamber defining a processing space and including a substrate support therein for supporting a substrate in the processing space and a gas inlet for introducing a process gas into said processing space. A plasma source is operable for creating a plasma in the processing space from process gas introduced therein. The plasma source comprises a dielectric window which interfaces with the processing chamber proximate the processing space and an inductive element positioned outside of the chamber and proximate the dielectric window. The inductive element is operable for coupling electrical energy through the dielectric window and into the processing space to create a plasma therein and comprises a variety of alternative designs for providing a dense, uniform plasma.

67 Claims, 10 Drawing Sheets

U.S. PATENT DOCUMENTS

| | | | |
|---|---|---|---|
| 4,941,915 * | 7/1990 | Matsuoka | 204/298.02 |
| 4,948,458 | 8/1990 | Ogle . | |
| 4,981,031 | 1/1991 | Schneider et al. . | |
| 5,122,251 | 6/1992 | Campbell et al. | 204/298.06 |
| 5,178,739 | 1/1993 | Barnes et al. . | |
| 5,226,967 | 7/1993 | Chen et al. . | |
| 5,231,334 | 7/1993 | Paranjpe . | |
| 5,234,529 | 8/1993 | Johnson . | |
| 5,277,751 | 1/1994 | Ogle . | |
| 5,280,154 | 1/1994 | Cuomo et al. . | |
| 5,304,279 | 4/1994 | Coultas et al. . | |
| 5,309,063 | 5/1994 | Singh | 315/111.51 |
| 5,368,710 | 11/1994 | Chen et al. . | |
| 5,401,350 | 3/1995 | Patrick et al. . | |
| 5,421,891 * | 6/1995 | Campbell et al. | 118/723 AN |
| 5,430,355 | 7/1995 | Paranjpe . | |
| 5,436,528 | 7/1995 | Paranjpe . | |
| 5,464,476 | 11/1995 | Gibb et al. | 118/723 |
| 5,556,521 | 9/1996 | Ghanbari . | |
| 5,558,722 | 9/1996 | Okumura et al. | 118/723 I |
| 5,560,776 | 10/1996 | Sugai et al. . | |
| 5,565,738 | 10/1996 | Samukawa et al. | 315/111.51 |
| 5,580,385 | 12/1996 | Paranjpe . | |
| 5,587,038 | 12/1996 | Cecchi et al. . | |
| 5,587,226 | 12/1996 | Leung et al. . | |
| 5,589,737 | 12/1996 | Barnes et al. . | |
| 5,591,493 | 1/1997 | Paranjpe . | |
| 5,619,103 | 4/1997 | Tobin et al. . | |
| 5,648,701 | 7/1997 | Hooke et al. . | |
| 5,650,032 | 7/1997 | Keller et al. | 156/345 |
| 5,669,975 | 9/1997 | Ashtiani . | |
| 5,683,537 | 11/1997 | Ishii . | |
| 5,685,941 | 11/1997 | Forster et al. . | |
| 5,688,357 | 11/1997 | Hanawa . | |
| 5,688,358 | 11/1997 | Tanaka et al. | 156/345 |
| 5,710,486 | 1/1998 | Ye et al. | 315/111.21 |
| 5,711,850 | 1/1998 | Okumura et al. . | |
| 5,716,451 | 2/1998 | Hama et al. | 118/723 |
| 5,753,044 | 5/1998 | Hanawa et al. . | |
| 5,759,280 | 6/1998 | Holland et al. . | |
| 5,763,851 | 6/1998 | Forster et al. . | |
| 5,783,492 | 7/1998 | Higuchi et al. . | |
| 5,785,878 | 7/1998 | Lingampalli . | |
| 5,800,619 | 9/1998 | Holland et al. | 118/723 I |
| 5,800,688 | 9/1998 | Lantsman et al. . | |
| 5,824,158 * | 10/1998 | Takeuchi et al. | 118/723 I |
| 5,824,607 | 10/1998 | Trow et al. . | |
| 5,874,704 | 2/1999 | Gates . | |
| 5,888,413 | 3/1999 | Okumura et al. | 216/68 |
| 5,891,349 | 4/1999 | Tobe et al. . | |
| 5,897,712 | 4/1999 | Hanawa et al. | 216/68 |
| 5,897,713 | 4/1999 | Tomioka et al. | 118/723 I |
| 5,907,221 | 5/1999 | Sato et al. | 315/111.51 |
| 5,919,382 | 7/1999 | Qian et al. | 219/121.52 |
| 5,976,334 * | 11/1999 | Fu et al. | 204/298.01 |

* cited by examiner

PROCESS APPARATUS AND METHOD FOR IMPROVING PLASMA DISTRIBUTION AND PERFORMANCE IN AN INDUCTIVELY COUPLED PLASMA

FIELD OF THE INVENTION

This invention relates generally to semiconductor processing utilizing a plasma, and specifically relates to the improvement of plasma distribution and process performance within a plasma generated and sustained through inductive coupling.

BACKGROUND OF THE INVENTION

Gas plasma generation is widely used in a variety of integrated circuit (IC) fabrication processes, including plasma etching, plasma enhanced chemical vapor deposition (PECVD), and plasma sputter deposition applications. Generally, plasmas are produced within a process chamber by introducing a process gas into the chamber and then directing electrical energy into the chamber for creating an electrical field therein. The electrical field creates an electron flow within the chamber which ionizes individual gas atoms and molecules by transferring kinetic energy through individual electron-gas molecule collisions. The electrons are accelerated within the electric field, producing efficient ionization. The ionized particles of the gas and free electrons collectively form what is referred to as a gas plasma or discharge. The plasma may exist at various ionization levels from $10^{-6}$ up to fully ionized plasma (based on the fraction of ionized particles with respect to the total number of particles).

The plasma particles will generally be positively charged, and are commonly utilized for etching a surface of a substrate within the chamber or depositing a layer of material onto such a substrate. Within an etching process, the substrate may be negatively biased such that the positive plasma particles are attracted to the substrate surface to bombard the surface and thus remove surface particles or etch the substrate. In a sputter deposition process, a target may be positioned within the chamber opposite the substrate. The target is then biased so that plasma particles bombard the target and dislodge, or "sputter," target particles therefrom. The sputtered target particles then deposit upon the substrate to form a material layer on an exposed surface thereof. In a plasma enhanced CVD process, the electrically neutral, active, radicals form a deposited layer on exposed surfaces.

Generally, there are various different ways of producing a plasma within a process chamber. For example, a pair of opposing electrodes might be oriented within the chamber to capacitatively couple energy to the plasma. A microwave resonant chamber utilizing ultra-high frequency microwave fields might also be utilized. Electron cyclotron resonance (ECR) devices, on the other hand, use controlled magnetic fields in conjunction with microwave energy to induce circular electron flow within a process gas to create and sustain a plasma. Inductive coupling processes are also popular, and are particularly desirable for their capability of producing a high-density plasma. Inductively coupled plasmas (ICP) generally utilize a shaped coil or antenna positioned with respect to the processing chamber to inductively couple energy into the processing chamber and thus create and sustain a plasma therein.

For example, in one particular design for an inductively coupled plasma (ICP) system, an inductive coil or antenna is positioned proximate the top portion of the chamber to create a plasma within the chamber. More specifically, the antenna is positioned on one side of a dielectric plate or window at the top of the processing chamber, and electrical energy from the antenna is coupled through the dielectric window and into the plasma. One such design is illustrated in U.S. Pat. No. 5,556,521 which is commonly owned with the present application.

In an alternative ICP processing system, a helical or solenoidalshaped coil is wound around the outside of a sidewall portion of the processing chamber to inductively couple energy to the plasma through the chamber sidewall, rather than through the top of the chamber. In such a system, a portion of the chamber sidewall is fabricated from a dielectric material through which the inductively coupled energy may pass. One suitable dielectric material for a window or chamber sidewall is quartz. Various ICP systems are known and utilized in the art, as evidenced by various issued patents directed to particular ICP details, such as plasma uniformity, RF matching, and the performance characteristics of the antennas or other inductive elements.

The geometry of an ICP system is a significant factor in determining both the plasma density and uniformity, and ultimately, the processing uniformity over the area of the substrate. For today's processes, it is desirable to produce a uniform, high-density plasma, over a significantly large area so that large substrate sizes might be accommodated. For example, manufacturing of today's ultra large-scale integrated (ULSI) circuits requires a dense, uniform plasma over large substrates having diameters of approximately 200 mm.

More specifically, in an ICP system, the plasma is excited by heating or exciting electrons in the plasma region of the processing chamber. The inductive currents which heat the plasma electrons are derived from oscillating magnetic fields which are produced proximate the inside of the dielectric window or sidewall by RF currents within the inductive antenna or coil. The spatial distribution of those magnetic fields is a function of the sum of the individual magnetic fields produced by each portion or segment of the antenna or coil conductor. Therefore, the geometry of the inductive antenna or coil significantly determines the spatial distribution of the plasma, and particularly the spatial distribution and uniformity of the plasma ion density within the process chamber. As one example, an antenna having an 'S' shape, such as that disclosed in U.S. Pat. No. 5,669,975, establishes a significant ion density in the central area of the antenna. At higher RF power levels, the outer portions of the antenna will also contribute significantly to plasma ionization. While a significant advantage of an ICP system utilizing such an antenna is the linearity of the system with respect to the power delivered to the antenna and also the radius of the process chamber, and while the current ICP systems and antenna designs utilized therein have provided sufficient plasma generation, such systems still have certain drawbacks.

For example, within the confines of existing ICP systems and antenna configurations, it is difficult to scale the process chamber to a larger size for handling larger substrates without significantly increasing the dimensions of the antenna or coil. An ICP antenna with a larger footprint must be accommodated with expensive modification to the processing system. Furthermore, larger antennas and their associated plasmas exhibit greater sensitivity to process parameters within the chamber. For example, the plasma process, such as an etch or deposition process, becomes more sensitive to process parameters such as the substrate-to-target distance within a sputtering system, the target material within a sputtering system, the pressure within the process chamber, and the height and width configuration of the chamber.

Furthermore, current ICP systems utilizing planar spiral antennas have exhibited asymmetry wherein the distribution of the plasma is not aligned with the central axis of the chamber. Such plasma asymmetry degrades the uniformity of the plasma and the uniformity of the deposition or etch process, thereby affecting the overall system efficiency. Still further, planar antennas may exhibit a ring or doughnut-shaped plasma for one process and corresponding set of parameters, while creating a centrally peaked plasma for another process and other parameters. Accordingly, the plasma shape and uniformity is not consistent within such ICP systems and will be process dependent. Therefore, the overall IC fabrication process will not be consistent from one plasma process to another plasma process.

Another drawback with planar antenna systems utilizing an S-shaped antenna or coil, is that the outer portions of the coil marginally affect the plasmas created by the central region of the coil, thus giving an azimuthal dependence within the plasma, and a corresponding azimuthal dependence in the etched or deposited films on the substrate. That is, along one axis of the plane defined by the coil, the plasma will have a different uniformity and density than along another planar axis of the coil.

Accordingly, it is an objective of the present invention to overcome drawbacks in the prior art and provide a plasma processing system, and particularly an ICP system, in which a dense, uniform plasma is created.

It is another objective of the present invention to provide a uniform plasma which is less dependent upon the size and shape of the process chamber than current plasma processing systems.

It is still another objective to provide a plasma which is symmetrical in the processing chamber.

It is another objective of the present invention to provide a uniform, dense plasma over a large area, such as an area sufficient to handle a 200 mm wafer, while maintaining a compact and inexpensive design of the inductive coil or antenna.

It is still another objective of the present invention to provide consistent plasma generation and thereby provide consistent processes, such as etch processes and deposition processes, which are less dependent upon process parameters, such as pressure and/or chamber geometry or size.

These and other objectives will become more readily apparent from the description of the invention set forth below.

SUMMARY OF THE INVENTION

The above objectives of the present invention are addressed by a processing system for processing a substrate with a plasma which utilizes uniquely shaped inductive elements for generating and maintaining the plasma. The systems described herein utilizing an inductive element configured in accordance with the principles of the present invention create a uniform and dense plasma over a significantly large area in the chamber without requiring a significant increase in chamber size for accommodating the inductive element. Whereas, in prior art plasma processing systems, increased energy introduced into the plasma required a significant increase in the size of the inductive element as well as the corresponding size of the processing chamber, the present invention provides dense uniform plasmas while maintaining a compact, and therefore relatively inexpensive processing system.

Specifically, the processing system comprises a processing chamber defining a processing space therein, and including a substrate support for supporting a substrate within the processing space. A gas inlet introduces a process gas into the processing space, and a plasma source of the system is operable for creating a plasma from the process gas. The plasma source comprises a dielectric window having a generally planar surface, which interfaces with the processing chamber proximate the processing space where the plasma is to be created. An inductive element is positioned outside of the chamber and proximate the dielectric window and is operable for coupling electrical energy inductively through the dielectric window and into the processing space to create and maintain a plasma therein.

The invention contemplates various different designs of the inductive element for achieving the goals of the present invention. In one embodiment of the invention, the inductive element comprises a coil which has multiple coil turns disposed successively along the length of the coil and from one side of the dielectric window. At least one of the coil turns is oriented in a first plane, and another of the coil turns is oriented in a second plane which is angled from the first plane. Specifically, multiple coil turns are oriented within the first plane and multiple coil turns are also oriented in planes which are angled from the first plane. The first plane is oriented generally parallel to a planar surface of the dielectric window. In that way, the coil turns within the first plane lie flat against the dielectric window. The coil turns angled from the first plane are disposed at an angle to the dielectric window. In one embodiment, the coil turns which are angled with respect to the first plane are oriented to be generally perpendicular to the first plane. In other embodiments, the coil turns are angled at less than 90° from the first plane. Preferably, multiple sets of coil turns are oriented in the first plane whereas the coil turns that are angled from the first plane are positioned between those sets of coil turns. In that way, a uniform plasma is created. By maintaining some coil turns of the inductive element within a plane that is flat against the dielectric window, plasma stability is maintained. Utilizing coil turns which are angled from the planar dielectric window provides for a greater number of coil turns along the dielectric window than would be achieved utilizing a generally planar coil of generally the same dimensions. That is, the inventive element creates a dense uniform plasma utilizing a compact design which does not require significant increases in the size of the processing chamber. The coil turns oriented within the first plane are coplanar and concentric, and define an inner coil end and an outer coil end. In alternative embodiments of the invention, the coil turns which are angled with respect to the planar dielectric window are coupled to the coil turns within the first plane, either at the inner coil end or at the outer coil end to vary the configuration of the inductive element and thus vary its effect on the plasma.

In accordance with another aspect of the present invention, the processing system may comprise a second inductive element, such as a helical coil wrapped around a chamber sidewall section which is utilized in conjunction with the inventive inductive element. In that way, electrical energy is inductively introduced into a plasma both from the end of the chamber as well as from the sidewall of the chamber. Preferably, each of the inductive elements is coupled to an independent electrical energy source for independently biasing the first and second inductive elements. Also, Faraday shields are preferably positioned between each of the inductive elements and plasma to enhance the inductive coupling of electrical energy into the plasma and reduce capacitive coupling.

The present invention, utilizing multiple, independently-biased inductive elements may be utilized for a variety of different processes, including etching processes and deposition processes. The present invention has been found to be particularly useful for ionized physical vapor deposition (iPVD). To that end, the target material might be positioned proximate the dielectric window to be sputtered by a plasma generated by the inventive inductive element proximate that dielectric window.

In accordance with another aspect of the present invention, the inductive element utilized with the dielectric window at an end wall of the chamber comprises a coil having multiple coil turns. However, rather than the coil turns being within a plane which is parallel to the planar dielectric window and other planes which are angled from the planar dielectric window, the alternative inductive element has portions of the various coil turns which are oriented and spaced in generally horizontal planes to form vertically stacked coil turns. The vertically stacked coil turns are oriented generally parallel to the dielectric window. Again, utilizing stacked coil turns, a greater number of coil turns may be utilized within the inductive element without increasing the overall horizontal footprint of the element and thus increasing the size of the processing chamber that is necessary for accommodating the inductive element.

In accordance with another aspect of the present invention, the inductive element is not in the form of a coil, but rather, comprises a plurality of repeated conductor segments arranged in a non-coil fashion and positioned in a circular pattern around the center of the inductive element. In one embodiment, the repeated conductor segments of the inductive element are disposed to extend radially outwardly from the center of the inductive element. In another embodiment, the repeated segments themselves form individual coils. The coils are arranged in a circular pattern around the center of the inductive element and are not simply successive individual turns of a larger coil element. The inductive element comprising a plurality of repeated conductor segments may be formed as repeated segments within a single plane, or may comprise layers of repeated conductor segments. For example, the repeated conductor segments of the inductive element may form a first layer, and a second layer may be formed by similar repeated conductor segments which are generally co-extensive with those segments in the first layer. The repeated conductor segments might also be utilized to couple energy into the chamber from both an end wall portion of the chamber and a sidewall portion. To that end, the repeated conductor segments include horizontal segments oriented along a chamber end wall and vertical segments oriented along a sidewall.

In accordance with another aspect of the present invention, a processing system may utilize an inductive element which is operable for coupling energy to the processing space simultaneously from both a sidewall portion and an end wall portion of the chamber. To that end, the processing chamber has a sidewall portion and end wall portion which are formed of a dielectric material. In conventional processing chambers, an end wall portion, such as a dielectric window, might be utilized in conjunctive with a planar conductive element. Alternatively, a conventional processing chamber might utilize a sidewall formed of a dielectric material wherein a helical coil is wrapped around a sidewall for inductively coupling energy into the system. In accordance with the principles of the present invention, the processing chamber includes both a sidewall portion and an end wall portion formed of a dielectric material. The inductive element comprises a segment thereof which is oriented along the chamber sidewall portion and also a segment thereof which is oriented along the chamber end wall portion for coupling energy simultaneously into the processing space, both through the sidewall and end wall portions of the chamber. To that end, the inductive element comprises a coil having multiple coil turns. Segments of the coil turns are oriented along the chamber sidewall portion, and other segments of the coil turns are oriented along the chamber end wall portion. The coil may be configured such that sections of the coil turn segments which are oriented along the sidewall are angled from each other. For example, sidewall sections of the coil turns might be oriented generally perpendicularly to other sidewall sections of the coil turns. Alternatively, the sidewall sections might be disposed at various different angles rather than a right angle associated with a perpendicular orientation. The coil generally has sets of coil turns with one set of turns being positioned generally along one side of the chamber and another set of turns being positioned generally along another side of the chamber.

The processing system of the present invention utilizing the inventive inductive elements provide dense, uniform plasmas in a compact design. The inventive primary inductive elements may be utilized in conjunction with secondary inductive elements for further enhancing plasma processes, such as ionized physical vapor deposition. The invention may be utilized to induce greater amounts of electrical energy into a sustained plasma without requiring an expensive increase in the size of the chamber necessary for accommodating the inductive element. These advantages and other advantages of the present invention are set forth in the detailed description hereinbelow.

BRIEF DESCRIPTION OF THE FIGURES

The accompanying drawings, which are incorporated in and constitute a part of this specification, illustrate embodiments of the invention and, together with a general description of the invention given below, serve to explain the principles of the invention.

DETAILED DESCRIPTION

Figure 1A:
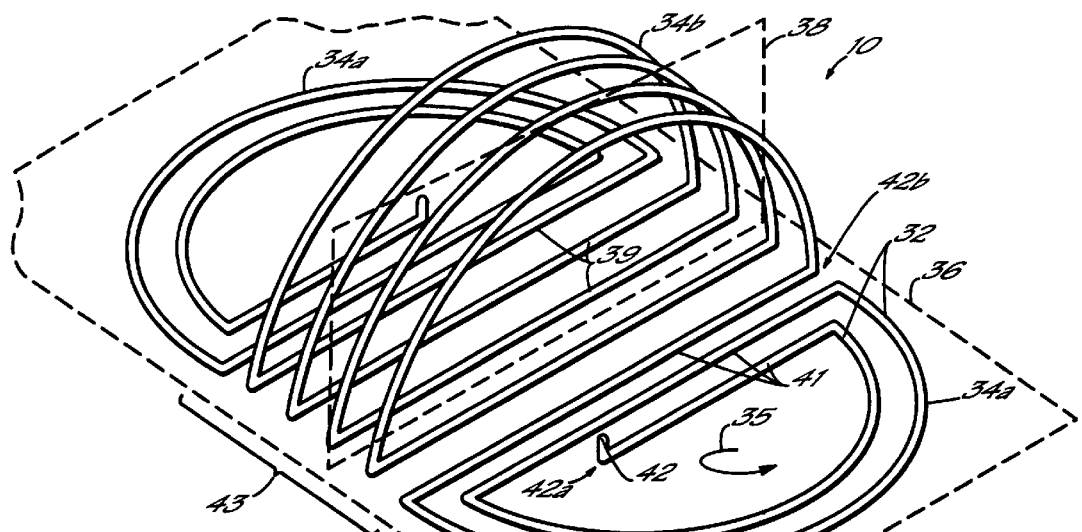
FIG. 1A is a perspective view of an inductive element utilized in the plasma processing system of the invention.
Figure 1B:
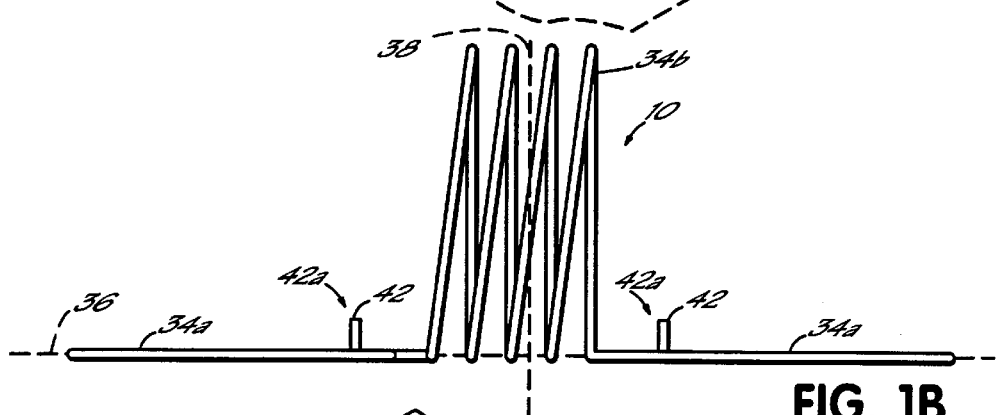
FIG. 1B is a front view of the inductive element of FIG. 1A.
Figure 1C:
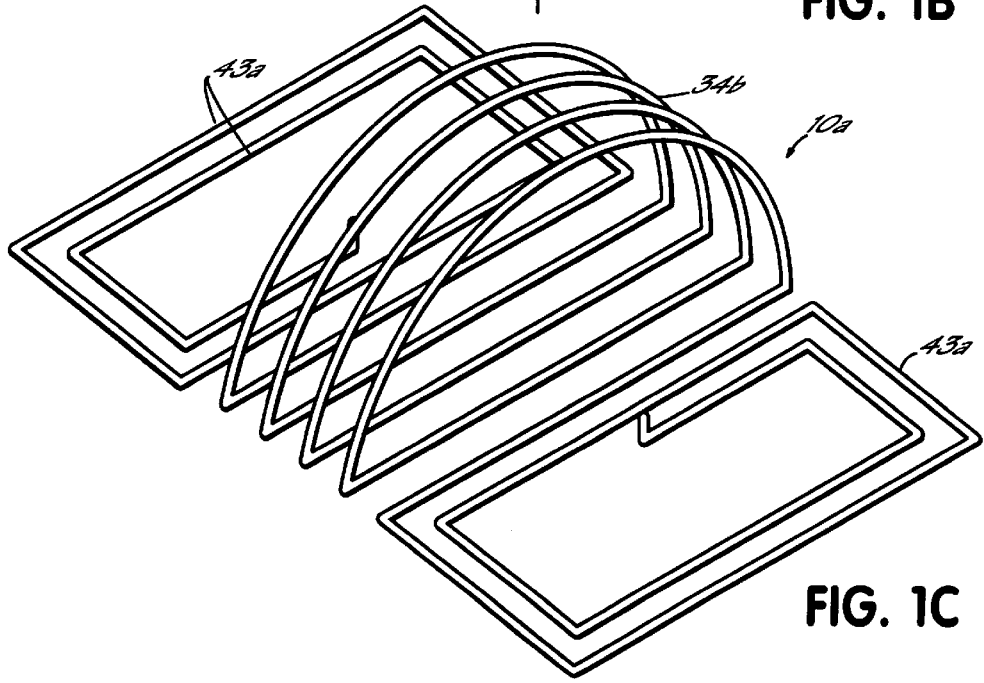
FIG. 1C is a perspective view of an alternative embodiment of an inductive element in accordance with the principles of the present invention.
Figure 1D:
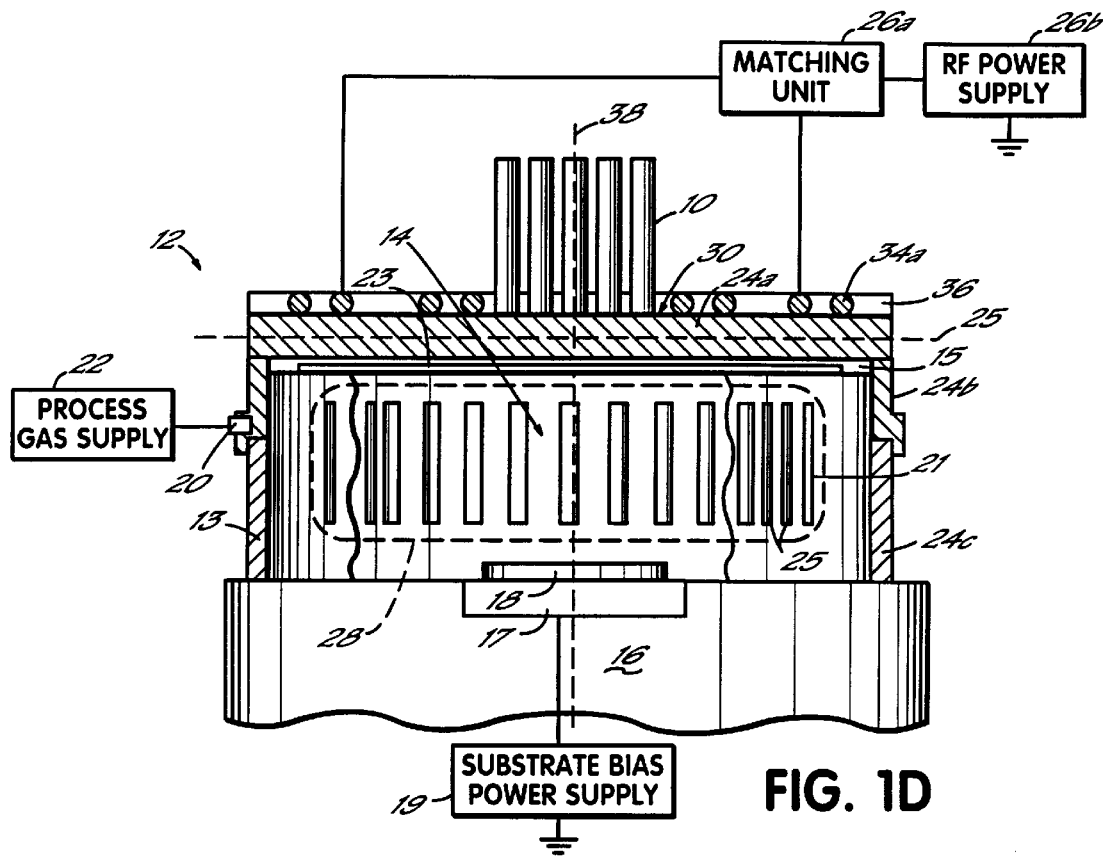
FIG. 1D is a side schematic partially broken away view of a plasma processing system in accordance with the principles of the present invention.

FIG. 1A is a perspective view of an embodiment of an inductive element in accordance with the principles of the present invention for use in a plasma processing system, such a s that shown in FIG. 1D. Inductive element 10 is utilized to inductively couple electrical energy into a processing chamber, for igniting and sustaining a plasma for processing a substrate. Plasma processing is widely used in IC fabrication. For example, the inventive system might be used for sputter etching and deposition processes, plasma-enhanced CVD (PECVD) processes, ionized PVD (iPVD) processes, and reactive ion etching processes (RIE).

FIG. 1D illustrates a processing system 12 with a processing chamber 13 which defines a processing space 14 therein. Processing system 12 is suitable for use with various of the inductive elements described herein. A substrate support 17 in space 14 is configured for supporting a substrate 18 to be processed. The substrate support 17 may be associated with a larger base 16. A gas inlet 20 is coupled to a process gas supply 22, such as an argon gas supply, for introducing a process gas into the processing space 14 to form a plasma. A substrate bias power supply 19 biases the substrate support 17 and substrate 18 as is known in the art of plasma processing. The processing system further includes a window or top portion 24a formed from a dielectric material, such as quartz or alumina, which is utilized to inductively couple electrical energy from element 10 into the processing space 14.

To that end, an inductive element, such as element 10, illustrated in FIG. 1A, is positioned on top of the dielectric window 24a. The processing system further includes sidewalls 24b and 24c, surrounding the processing space 14. Portions of sidewall 24c may be formed from a dielectric material, such as quartz, while another portion 24b is formed from metal. Portions of sidewall 24c may be utilized to inductively couple electrical energy from an inductive element into space 14, as discussed further below. The inductive element may be any of several inductive elements disclosed herein and element 10 is utilized for illustrative purposes only in FIG. 1D. The inductive element 10 is coupled through a matching unit 26a to a source of electrical energy, such as RF power supply 26b, which biases the inductive element 10 to create varying RF magnetic fields in the processing space 14 for forming a plasma 28 therein, in accordance with known ICP principles. The matching unit is an electrical circuit well known to those of ordinary skill in the art to accommodate the impedances of RF power supply 26b and inductive element 10 to provide maximum delivered power into the element 10 and plasma under various conditions. Plasma 28 is then utilized for processing substrate 18, such as by plasma etching or sputter deposition, according to principles well known to a person of ordinary skill in the plasma processing art.

The inductive magnetic fields, created by RF currents within the inductive element 10, are coupled into space 14 through dielectric window 24a. Dielectric window 24a is generally planar, and will have a planar surface 30 against which the inductive element 10 is oriented. Of course, non-planar windows might be utilized and the window may have contoured surfaces or other shaped surfaces in accordance with dielectric windows known in the prior art. The configuration of the inductive element 10 and its position with respect to the processing chamber 12 and dielectric window 24a will affect the shape, density, and uniformity of the plasma, in accordance with the principles of the present invention. The present invention addresses various of the shortcomings in prior art plasma processing systems by using unique designs for the inductive elements to vary the plasmas created within the processing chamber by such inductive elements.

To enhance inductive coupling into processing space 14, Faraday shields might be used. An upper Faraday shield 15 is shown positioned proximate the dielectric window 24a in FIG. 1D, proximate the side of the window facing toward the inside of the chamber 13 and toward substrate 18. A lower Faraday shield 21 might be positioned in the chamber and oriented along one side of the dielectric c sidewall 24c. While both Faraday shields 15, 21 are shown positioned on the inside of chamber 13, they may be positioned on the outside of the chamber as well. The Faraday shields are placed between any inductive elements, such as element 10, and the processing space 14 where the plasma is generated. The lower Faraday shield 21 may be particularly useful when utilizing a second inductive element, such as an element around sidewall 24c (see FIGS. 8A–8B). Faraday shields are known in the art and effectively provide improved inductive coupling of energy from element 10, across the dielectric window, and into the processing space. Faraday shields also reduce undesired capacitive coupling between the inductive elements and the plasma.

Figure 1E:
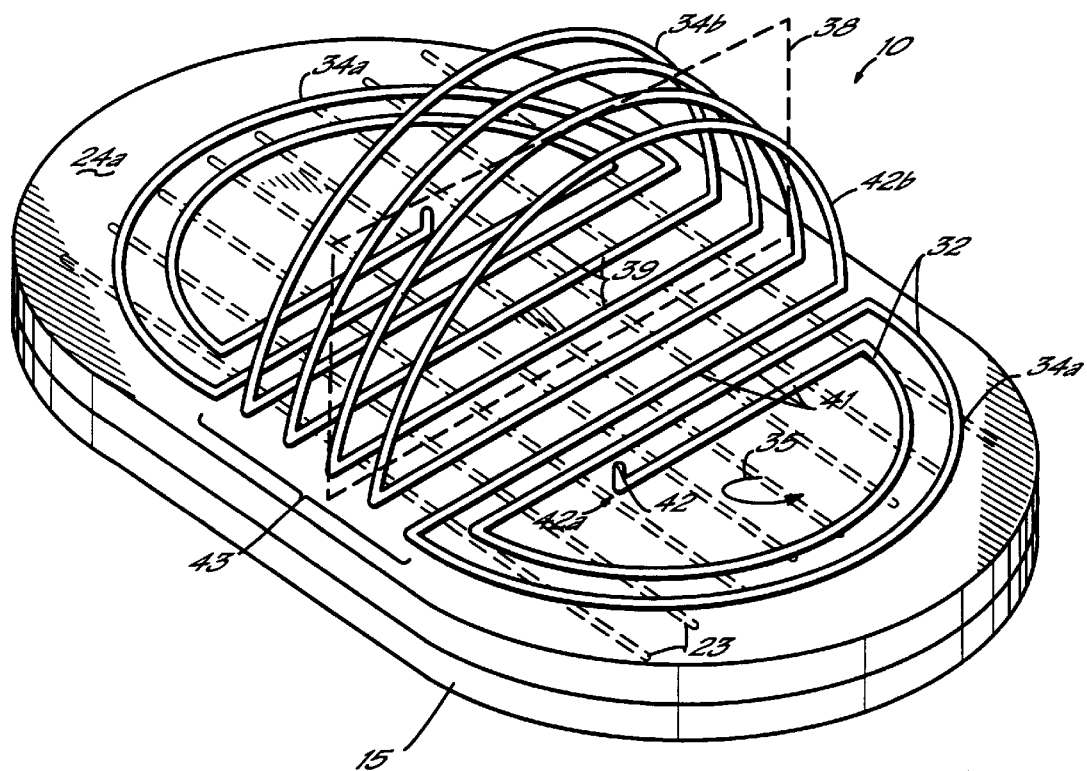
FIG. 1E is a perspective view of the inductive element of FIG. 1 utilized with a Faraday shield.
Figure 6A:
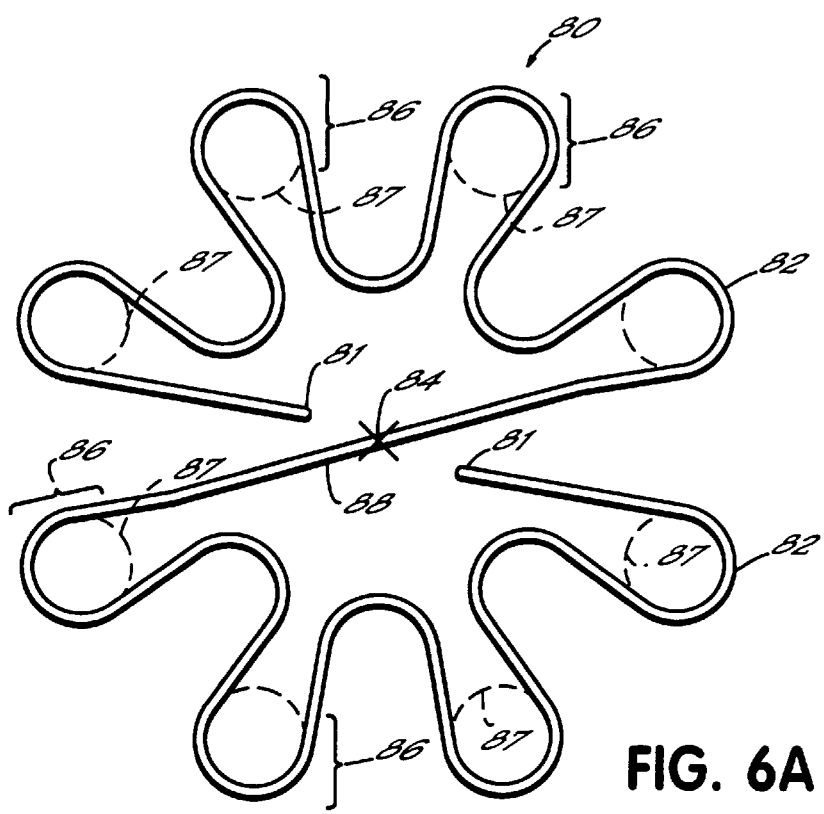
FIG. 6A is a top view of an alternative embodiment of a planar inductive element in accordance with the principles of the present invention.

Generally, the Faraday shields will include a plurality of slots formed in the shields, as illustrated in shields 15, 21 of FIG. 1D. In shield 15, the slots 23 are arranged to extend from one end of the shield to the next, as illustrated in FIG. 1E. Shield 15, as shown in FIG. 1E, is in the form of a plate made of metal, which has a plurality of generally horizontal and parallel slots 23 formed therein. Shield 21 is in the form of a cylindrically shaped element wrapped around the inside of the sidewall 24c with generally vertical slots 25 therein. However, the slots, such as slots 23 in shield 15, might also be configured in other orientations depending upon the shape of the inductive elements. For example, the slots might follow the shapes of the conductors in other inductive elements, as shown in FIGS. 6A, 6D or 7D, and discussed further below.

Returning to FIG. 1A, the inductive element 10 which might also be referred to as an antenna, is in the form of a coil having multiple coil turns 32. The terms "inductive element" and "antenna" are used interchangeably herein. The inductive element or coil is formed of an electrical conductor according to principles known in the art. The conductor, such as an elongated metal wire or metal tubing, is configured and shaped in accordance with the principles of the present invention to form an element which will inductively couple energy into a processing chamber when an electrical current is passed through the element.

Referring to FIG. 1A, the coil 10 comprises multiple, successive coil turns 34a, 34b which are disposed successively along the length of the coil. When utilized in conjunction with a dielectric window in accordance with the principles of the invention, the coil turns are disposed successively from one end of the dielectric window 24a to another end of the window, or from one side to the other side, as shown in FIG. 1D. That is, the coil turns of at least one of the embodiments of the invention are arranged one turn after the other across the dielectric window. At least one of the coil turns of element 10, such as coil turn 34a is oriented in a first direction or plane defined by a generally horizontal plane, as illustrated in FIG. 1A by the dashed line 36 and by a similar reference numeral in FIG. 1D. Other of the coil turns 34b are oriented in second directions or second planes, as illustrated by the generally vertical plane of reference numeral 38 (FIG. 1A). In accordance with the principles of the present invention, coil turn 34a is oriented in a first plane, such as plane 36, which is angled from the second plane, such as plane 38, in which coil turn 34b is oriented. In one embodiment, plane 36 and coil turn 34a are generally perpendicular to plane 38 and coil turns 34b.

In a processing system, such as system 12 shown in FIG. 1D, inductive element 10 is positioned against one side of the dielectric window 24a such that the first horizontal plane 36 is oriented generally parallel to a planar top surface 30 of the dielectric window. That is, the coil turn 34a and other similarly oriented coil turns of element 10 are oriented in a plane generally parallel to the planar surface 30 of the dielectric window 24a. In such an orientation, coil turn 34b, and coil turns similarly oriented as coil turn 34b, are oriented in vertical plane 38 and in other vertical planes similarly oriented but laterally spaced from plane 38, as shown in FIGS. 1D and 1E. The coil turns 34b are thus oriented generally perpendicular to the planar surface 30 of the dielectric window. In the embodiment of FIG. 1A, multiple coil turns, like e turn 34a, are oriented generally horizontally and are generally co-planar and concentric with each other. Coil turns 34b are angled above the horizontal plane 36 and, in the embodiment of FIG. 1A, are generally vertically oriented. The coil turns 34b are not co-planar, but rather lie in spaced vertical planes. The spaced vertical planes 38 are generally parallel to each other, as shown in FIGS. 1A and 1D.

Although coil turns 34b are generally vertically oriented, those turns also include segments 39 which are oriented generally in or parallel to plane 36. The segments 39 are generally parallel to each other and are generally parallel to segments 41 of coil turns 34a. The combined segments 39, 41 of the various coil turns of element 10 create an area, indicated by bracket 43 in FIG. 1A, which results in a large area of effective ionization within the plasma. The area of effective ionization 43 is larger than the area that may be achieved with prior art, completely planar coils having generally similar horizontal footprints.

For example, because a number of the coil turns (ie., turns 34b), are not co-planar with the turns 34a, those turns 34b may contribute the segments 39 for plasma ionization without requiring additional turns around the outside of the existing turns 34a. As may be appreciated, in prior art flat coils, such as an S-shaped coil as in FIG. 1F, each additional segment 41 would require another co-planar and concentric turn 35 similar to turns 34a, around the outside of the existing turns. Those additional turns 35 would significantly increase the horizontal footprint of the coil. The larger coil footprint would, in turn, require a larger dielectric window 24 and a larger chamber 13, which increases the overall cost of the chamber and overall system. However, each additional segment 39 contributing to the ionization area 43 of the element 10 does not require another coil turn wrapped around the outermost coil turns in plane 36. Rather, the coil turns 34b are outside of plane 36 and only increase the vertical height of the element 10, rather than its horizontal footprint. Therefore, a processing chamber having a smaller horizontal cross-section may be utilized. The coil turns of element 10 are shown as generally semicircular in shape in FIGS. 1A, 1B, 1D and 1E, although they could have other shapes as well in accordance with the invention.

Inductive elements in accordance with the principles of the present invention, as shown in FIGS. 1A–1E, 2A–2B, 3A–3B, 4, 5A and 5B create a larger area of effective ionization within a plasma processing chamber than may be achieved with prior art planar elements which have generally similar-sized footprints.

In one embodiment, as illustrated in FIGS. 1D and 1E, the inductive element of the invention is positioned with respect to a Faraday shield so that the segments 39, 41, forming area 43, are oriented perpendicular to the slots of the Faraday shield. As shown in FIG. 1E, inductive element 10 is positioned above dielectric window 24a and slotted shield 15. The slots 23 are oriented in shield 15 to be generally perpendicular to the coil turn segments 39, 41 within area 43. Such an arrangement, as shown in FIG. 1E, ensures an even larger effective area of inductive energy coupling and gas ionization within a plasma than a system without such a shield.

Figure 1F:
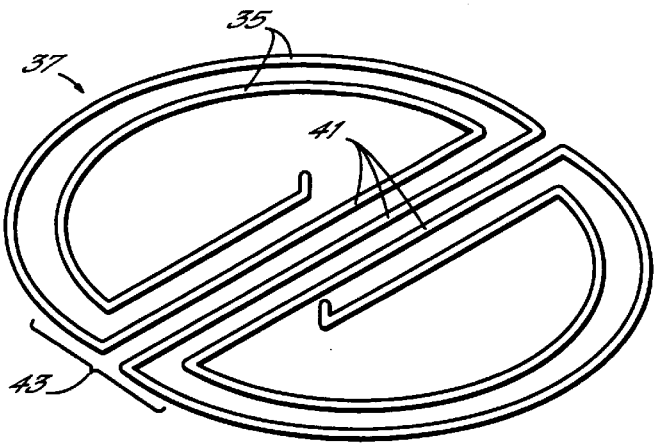
FIG. 1F is a perspective view of an inductive element.

Accordingly, a large, dense plasma may be created within the processing space 14 of a chamber 13 with the inventive inductive element 10 while maintaining the same cross-section dimensions of the dielectric window 24 and chamber 13 than may be achieved with prior art coil inductive elements and antennas. Furthermore, inductive elements like those illustrated in the Figures and described herein are less limited in their number of coil turns by the horizontal cross-sectional dimensions of the dielectric window and processing chamber. In that way, an increased number of useful coil turns may be utilized with the inductive elements of the invention within an area 43 than would be spatially possible with a purely planar coil antenna, such as an S-shaped antenna as shown in FIG. 1F. The principal plasma generation region 43 will generally be proximate the center of the inductive element, and therefore, utilizing the inventive designs, such as those of FIGS. 1A–1E, 2A–2B, 3A–3B, 4, and 5A–5B, for example, more coil turn segments 39, 41 might be positioned in the center region 43 of the inductive element for creating a more dense plasma while not significantly affecting the horizontal footprint or cross-section dimension of the inductive element. It has also been found that the inductive element 10 of the invention still maintains the stability of the plasma by maintaining certain coil turns (i.e., turns 34a) within a plane oriented generally parallel to the plane 25 of the dielectric window 24.

Generally herein, in describing the various inductive elements in accordance with the principles of the present invention, different orientations, directions, and planes of the various coil turns, coil turn portions, and coil turn segments or coil segments, will be described as "horizontal" and "vertical" with respect to a horizontal reference plane 25 derived from a dielectric window 24a of the embodiments of the processing system disclosed herein. Similarly, coil turns, coil turn portions, and coil turn segments will also be indicated as being parallel (horizontal) or perpendicular (vertical) with respect to that same horizontal reference plane 25. However, such nomenclature, such as "horizontal," "vertical," "parallel," and "perpendicular" is not absolutely limiting, and it will be readily understood by a person of ordinary skill in the art that an element that is indicated as horizontal with respect to one reference plane would actually be oriented vertically if the reference plane were rotated 90°. Furthermore, an element generally parallel to one reference plane will be generally perpendicular to another reference plane which might be oriented generally 90° from that first reference plane. Similarly, the coil turns of the inductive elements of the invention will not always be completely or absolutely within a single plane since they are turns of a coil. Rather, the coil turns, turn portions, and turn segments indicated as horizontal, vertical, parallel or perpendicular will also mean, where appropriate, that the turns, portions, segments or orientations are generally or predominantly vertical, horizontal, parallel or perpendicular, depending upon the configuration of the inventive inductive element. Furthermore, planes are utilized herein to illustrate directions or orientations; and are not meant to define the coil turns as always planar. As such, the invention, and specifically the invention as recited in the claims is not limited to absolute orientations, as will be understood by a person of ordinary skill in the art.

With the coils of element 10 similar to coil 34a in FIG. 1A, plasma current is maintained within a closed loop within the processing space 14 which stabilizes the plasma 28 inside of the processing space. The current loop is schematically shown as loop 35 in FIG. 1A. As mentioned above, another advantage with a coil design similar to those disclosed herein, such as element 10, is that the total number of coil turns within the inductive element 10 and the number of turns proximate the center of the element is not limited by the dimensions of the dielectric window as are prior art planar coils which use numerous concentric and co-planar coil turns within a horizontal plane. With the present invention, turns are angled above the horizontal plane and a larger number of perpendicular coil turns 34b may be positioned in the center of the inductive element 10 to thereby increase the number of effective turn segments 39 in the central area 43 of the element and the amount of energy coupled to the plasma without significantly increasing the overall diameter or length/width dimensions of the element 10 and the dielectric window.

Referring again to FIG. 1A, each of the generally perpendicular coil turns 34b includes a segment 39 which is disposed generally within horizontal plane 36 and thus generally parallel to planar surface 30 of the dielectric window 24. As discussed above, the inductive element or antenna 10 is configured such that the segments 39 are also generally parallel to each other and to turn segments 41. The combination of the coil turn segments 39 and 41 provides the principle plasma generation region of the inductive element 10. Varying the distance between each of the respective segments 39 and 41 may be utilized to spread the plasma within a processing space or to constrict the plasma. That is, a greater number of coil turn s in the inductive element 10 within generally the same horizontal footprint will space each of the respective segments 39, 41 closer together and thus make the plasma more dense. Fewer coil turns and greater spacing between the various coil turn segments 39 and 41 will make the plasma less dense.

As illustrated in FIG. 1B, the various vertical coil turns 34b are oriented generally parallel to the vertical reference plane 38. Because the vertical coil turns 34b must transition from one turn to the next, as shown in FIG. 1B, the vertical coil turns will not each be completely within a defined vertical plane which is absolutely parallel to the reference plane 38.

However, for the purposes of describing this invention, the vertical coil turns 34b will be considered to be generally parallel with reference plane 38 and generally perpendicular to reference plane 36 and planar surface 30 of the dielectric window 24a.

In one embodiment of the invention, as shown in FIG. 1A, the inductive element 10 is formed so that horizontal coil turns 34a are oriented generally within plane 36. The turns 34a are positioned on either side of the vertical coil turns 34b which are generally perpendicular to plane 36. In that way, the overall symmetry of the plasma is maintained. RF power from the RF power supply 26b is coupled to element 10 utilizing matching unit 26a at segments 42 which are shown in a generally upright position in FIG. 1B. However, the segments 42 might also be oriented within plane 36. The segments 42 are located at the inner end 24a of the coil. RF power is similarly coupled to the elements of FIGS. 1B–1D, 2A–2B, 3A–3B, 4, and 5A–5B at the ends of the coil forming the inductive elements.

Figure 4:
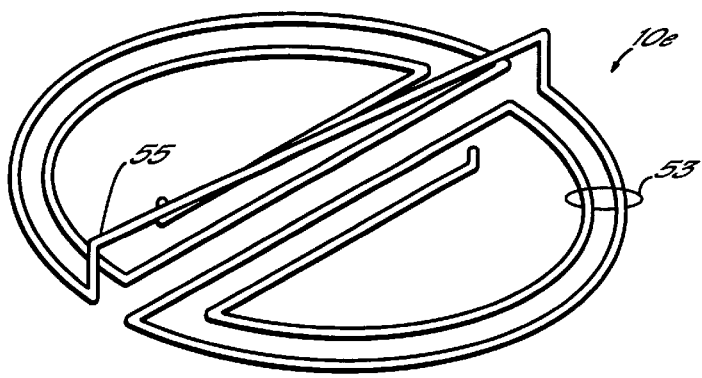
FIG. 4 is a perspective view of an alternative embodiment of an inductive element in accordance with the principles of the present invention.

The element 10 as shown in the embodiments of FIGS. 1A and 1B may be modified to fit any shape of dielectric window 24a. For example, the embodiment illustrated in FIGS. 1A and 1B utilizes horizontal coil turns 34a which have a semicircular shape suitable generally for a circular or elliptical dielectric window. An inductive element or antenna 10a, as shown in FIG. 1C, has horizontal coil turns 43a which are rectangular in shape, suitable for a rectangular dielectric window to make e most efficient use of the window shape and to ensure a large number of coil turns in element 1A. Similarly, the vertical turns 34b might be varied in shape to be rectangular or another shape, rather then semicircular, as shown in FIGS. 1A–1C and other Figures herein. FIG. 4 illustrates an element 10e which uses semicircular horizontal coil turns 53 and rectangular vertical turn 55. As will be readily understood by a person of ordinary skill in the art, various modifications may be made to the shape of the coil turns of the inductive elements described herein without departing from the scope of the invention. For example, a greater number or fewer number of horizontal turns 34a and/or vertical turns 34b may be utilized in accordance with the principles of the present invention to tailor a design for a particular processing space and chamber geometry.

Figure 2A:
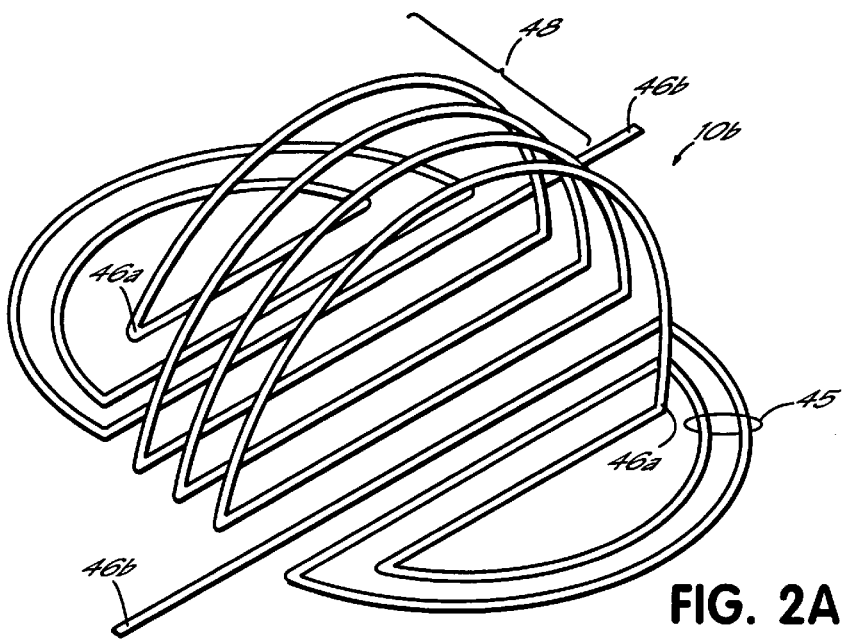
FIG. 2A is a perspective view of an alternative embodiment of an inductive element in accordance with the principles of the present invention.
Figure 2B:
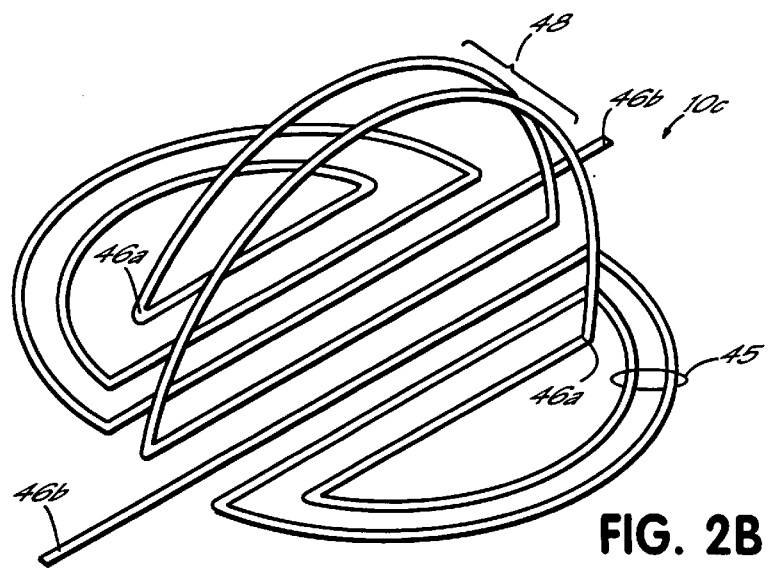
FIG. 2B is a perspective view of the inductive element of FIG. 2A with a reduced number of inductors in the central area.

Alternative designs for inductive elements or antennas utilized within an ICP system are illustrated in FIGS. 2A and 2B. Therein, the coupling between the horizontal coil turns and vertical coil turns are varied, due to a different configuration of the horizontal turns and their coupling to an RF power source.

Specifically, the inductive element 10 of FIG. 1A utilizes multiple horizontal coil turns 34a which are wound in a spiral fashion to define an inner coil end 42a and an outer coil end 42b. In the embodiment illustrated in FIG. 1A, the RF power is coupled to the horizontal coil turns proximate an inner coil end 42a. However, in the embodiment illustrated in FIG. 2A, RF power is coupled to the antenna 10b at outer coil ends 46b. At the inner coil ends 46a, the vertical coil turns 48 couple with the horizontal coil turns 48 to provide a unitary element 10b. In accordance with the principles of the present invention, the number of horizontal coil turns 45 and vertical coil turns 48 may be varied. For example, the antenna 10c in FIG. 2B utilizes fewer vertical coil turns 48 than the antenna 10b of FIG. 2A.

Figure 3A:
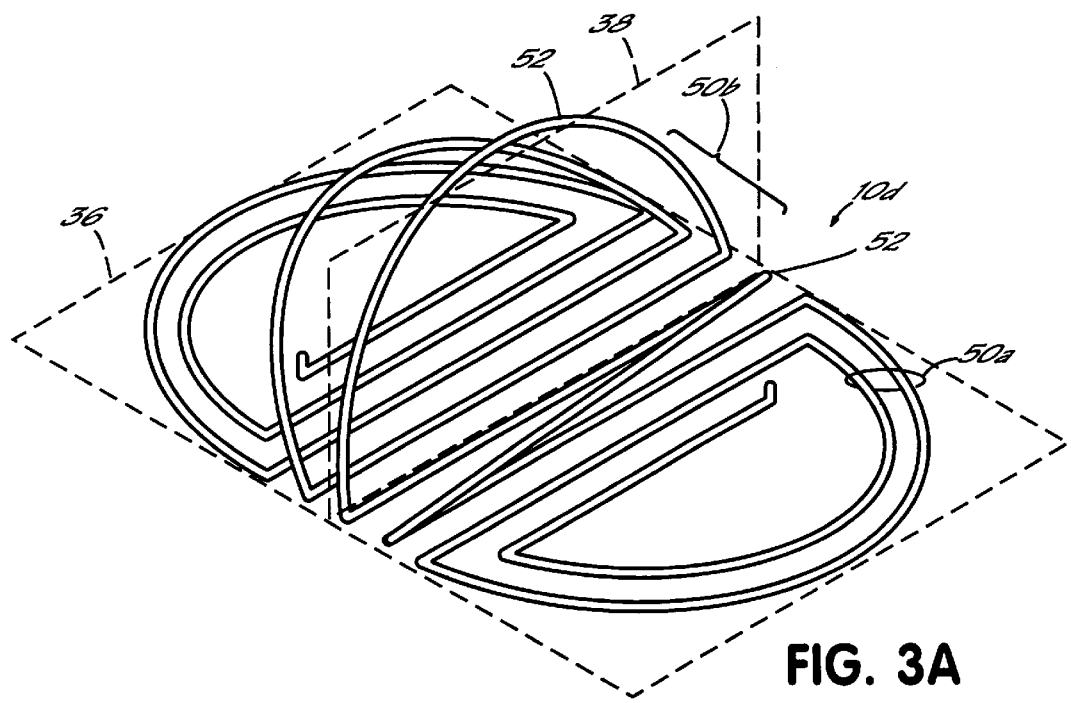
FIG. 3A is a perspective view of an alternative embodiment of an inductive element in accordance with the principles of the present invention.

Referring to FIG. 3A, another embodiment of the invention may utilize an inductive element with upstanding coil turns which are sloped or angled to lie in planes between the horizontal and vertical reference planes 36, 38. As illustrated in FIG. 3A, the inductive element 10d has horizontal coil turns 50a and upstanding coil turns 50b which lie generally outside of a horizontal plane. The horizontal coil turns 50a are positioned generally parallel to a horizontal reference plane 36 and thus would be generally parallel to dielectric window surface 30 (see FIG. 3B). Coil turns 50b are angled above the horizontal reference plane 36. One or more of the coil turns 50b may be positioned predominantly within a perpendicular or vertical plane 38. However, in accordance with another aspect of the present invention, other of the coil turns 50b, such as coil turns 52, may be sloped or angled between the horizontal and vertical reference planes 36, 38. The slope or angle of the coil turns 52 will affect the magnetic field contours of the element 1D penetrating through the dielectric window, and thus will affect the energy delivered to the plasma. As such, the slop e of the central coil turns 52 will affect the inductance properties of the antenna 10d and will provide variability with respect to the shape and density of the plasma. In that way, the slope of the coil turns 52 might be varied as appropriate for tailoring the operation of an inductive element or antenna to a particular processing chamber and to other parameters, such as the level of the RF power delivered to the plasma, to provide a desirable dense and uniform plasma.

Another advantage of the system of the present invention utilizing inductive elements or antennas as disclosed herein, is that the system may be utilized to eliminate "hot spots" with respect to the inductive element. Inductive elements generally have a primary portion or region thereof which is most responsible for coupling energy to a plasma. With an S-shaped coil of the prior art, as illustrated in FIG. 1F, that portion is generally in the center 43 of the element wherein the parallel segments of the coil turns are aligned. However, the principal plasma portion 43 of the inductive element 37 in FIG. 1F, often provides too much energy in certain areas of the plasma (i.e. a hot spot). As a result, the dielectric window 24a, such as a quartz window, may actually be sputtered, or eroded within an ICP system. Such sputtering of the dielectric window 24a may contaminate the overall plasma process whether a deposition or etch process. If a Faraday shield is used inside the chamber to reduce sputtering of the dielectric window, the shield itself might be sputtered, which may also contaminate the plasma process. In the inductive elements of the invention as illustrated in FIGS. 1A–1E, 2A–2B, and 3A–3B, the coil turns of the central area 43 of the elements are configured and arranged such that a predominant portion of those coils are above the horizontal plane, notwithstanding that certain segments of those coil turns, such as segments 39 are within a horizontal plane. With such a configuration, the inventor has determined that undesired hot spots in the plasma, and the resulting sputtering of a Faraday shield or the dielectric window may be reduced. Since such sputtering may cause contamination in the plasma processing of a substrate, the present invention will therefore reduce such contamination.

Figure 5A:
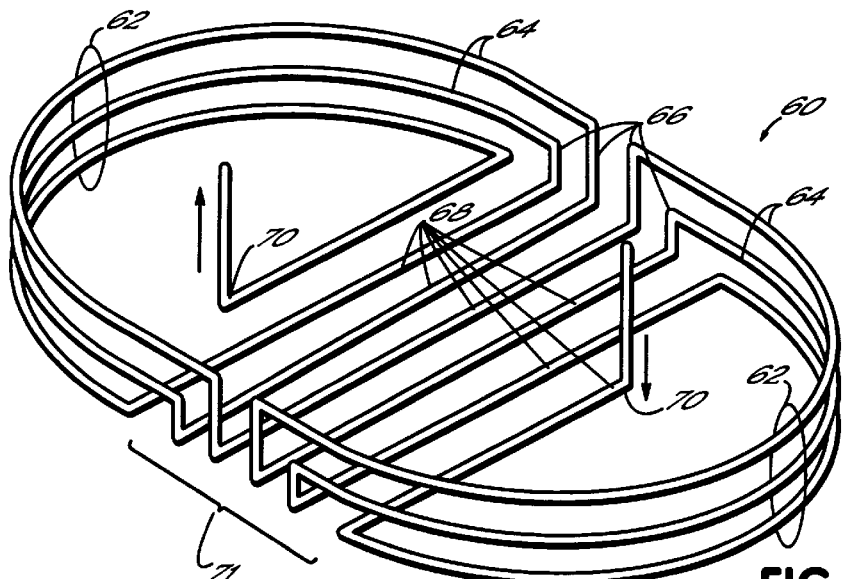
FIG. 5A is a perspective view of an alternative embodiment of an inductive element in accordance with the principles of the present invention.
Figure 5B:
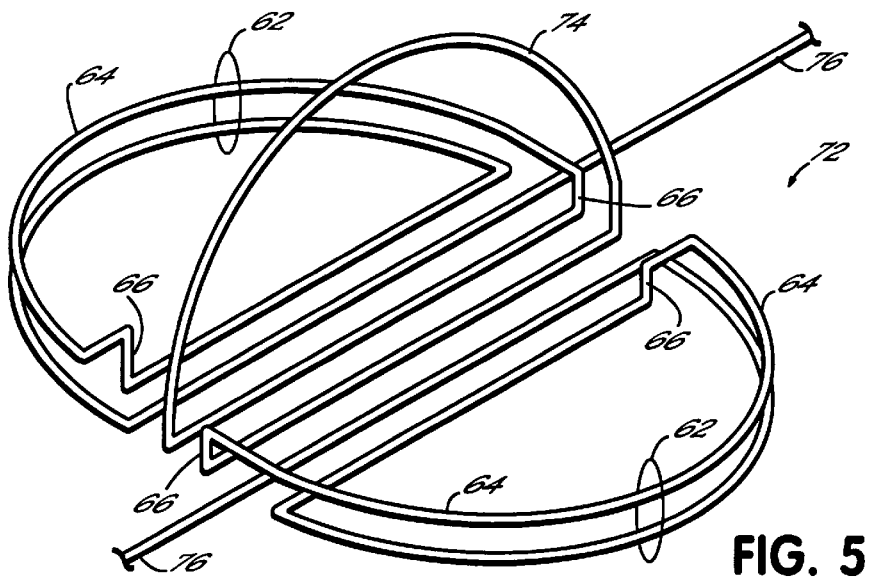
FIG. 5B is a perspective view of an alternative embodiment of an inductive element in accordance with the principles of the present invention.

FIGS. 5A and 5B illustrate additional embodiments of a three-dimensional inductive element for use in a processing system in accordance with the principles of the present invention. The inductive elements or antennas illustrated in FIGS. 5A and 5B utilize coil turns having segments or portions which are oriented outside of a generally horizontal plane for providing dense, uniform plasmas within a processing space without significantly increasing the overall horizontal footprint of the antenna design. In accordance with another aspect of the present invention, the inductive elements of FIGS. 5A and 5B utilize coil turns which may reduce the vertical heights of the elements as well. The elements in FIGS. 5A and 5B utilize additional coil turns raised vertically above a base plane, but which still extend generally horizontally to limit the overall vertical height of the element.

Referring now to FIG. 5A, inductive element 60 includes a plurality of coil turns 62. Several of the coil turns 62 include turn portions 64 which are oriented in spaced and generally parallel planes as shown in the Figures. The spaced and generally parallel planes are s shown as generally horizontally oriented. That is, if the inductive element 60 is positioned on top of a dielectric window, as illustrated in FIG. 1D, the portions 64 of the coil turns 62 would lie in generally horizontal planes parallel to the plane 25 defined by the dielectric window and space above that plane(see FIG. 1D). In that way, the coil turn portions form generally stacked coil turns. Several of the coil turns 62, however, also include portions or segments thereof 66 which are oriented generally vertically to raise the vertical height of portions of the coil turns, i.e., to vertically stack the coil turn portions that are horizontally oriented. The coil turns 62 are predominantly configured to be oriented horizontally. Therefore, several of the coil turns 62 of inductive element 60 include turn portions or segments which are stacked vertically with respect to each other, as shown in FIGS. 5A, 5B. While the configuration of inductive element 60 utilizes coil turns with vertically oriented portions 66 and horizontally oriented portions 64, the coil turns 62 are predominantly and generally horizontally oriented in a plurality of horizontal planes that are vertically spaced from each other in a stacked formation. That is, a significant portion or segment of each coil turn is generally horizontally oriented. The vertical portions 66 of the coil turn provide vertical spacing between the horizontal portions 64 such that the coil turns 62 form the stacked formation illustrated in FIG. 5A. In that way, the effective plasma generating region of the inductive element may be increased without significantly increasing the horizontal footprint of the inductive element. Furthermore, because the coil turns are configured to be predominantly oriented horizontally, the vertical height of the inductive element is also minimized. Specifically, the coil turns 62 include parallel portions 68 which are generally parallel to and co-planar with each other and define a central plasma-generating area 71 of the element 60. The stacked coil turns 62 provide for a greater number of portions 68 to be positioned proximate the center 71 of inductive element 60 without increasing the overall horizontal footprint of the inductive element, in accordance with the principles of the present invention. Additional coil turns 62 within the inductive element 60 are translated into additional vertical height to the inductive element rather than a larger horizontal footprint. Accordingly, inductive element 60 may be utilized to create or maintain dense, uniform plasmas without significantly increasing the horizontal cross-sectional size of a processing chamber in a plasma processing system. As illustrated in FIG. 5A, RF power is inductively coupled to the inductive element 60 at the inner coil ends 70. Since the coil turns 62 are stacked and predominantly horizontally oriented, the vertical height is not as significantly increased as with the element 10 in FIG. 1, for example. In that way, element 60 provides a horizontally and vertically compact design which may be used to maintain dense, uniform plasmas normally requiring substantially larger inductive elements.

Figure 3B:
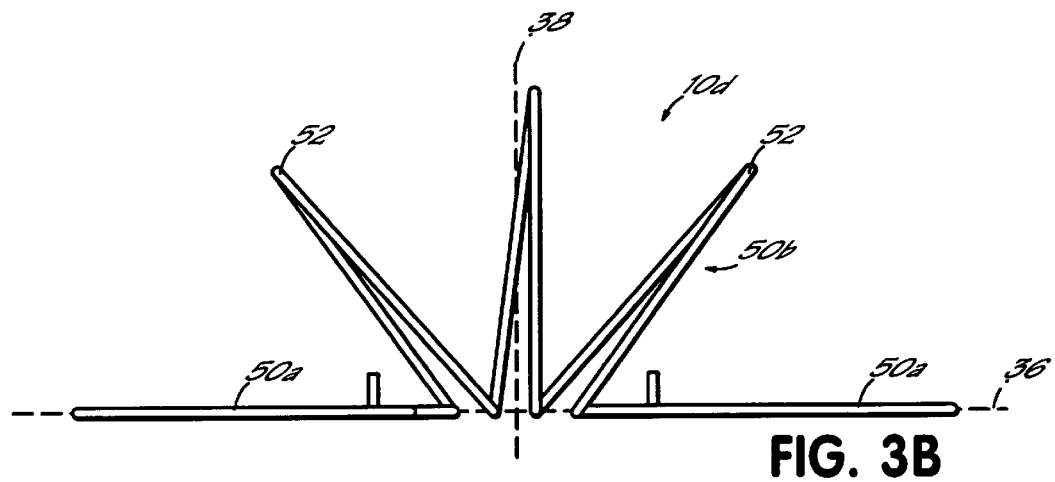
FIG. 3B is a front view of the inductive element of FIG. 3A.

FIG. 5B illustrates another embodiment of an inductive element in accordance with the principles of the present invention which utilizes a combination of various features from inductive element 60 in FIG. 5A, as well as features from inductive element 10 illustrated in FIG. 1A. More specifically, inductive element 72 includes coil turns 62 which are in the stacked formation as described or angled from the stacked formation. The coil turns 62 are predominantly located within horizontal planes, since the horizontal portions 64 of those turns are significantly longer than the vertical portions 66. In that way, the coil turns 62 are oriented in a stacked formation in vertically-spaced horizontal planes similar to inductive element 60 in FIG. 5A. Inductive element 72 also includes one or more coil turns 74 oriented at an angle to the stacked formation. In FIG. 5B, the coil turn 74 is oriented in a predominantly vertical plane, generally perpendicular to the stacked coil turns 62. However, the additional coil turn or turns 74 might be angled somewhere between the horizontal and vertical orientations. The RF power is coupled to the inductive element 72 at outer coil ends 76. While the coil turns of the elements in FIGS. 5A–5B are shown as generally semi-circular in shape, they may have other shapes as well. Also, while FIG. 5B illustrates coil turns 74 which are generally vertically oriented, they may be angled between the horizontal and vertical, as illustrated in FIGS. 3A and 3B.

FIGS. 6A–6D illustrate further alternative designs for inductive elements to utilize within a plasma processing system in accordance with the principles of the present invention. The elements of FIGS. 6A–6D are variations from traditional inductive elements in the form of coils having relatively closely spaced wound coil turns. That is, FIGS. 6A–6D illustrate embodiments of inductive elements which utilize repeated conductor segments arranged in a non-coil fashion. More specifically, with respect to the inductive element, the repeated conductor segments are not simply in the form of repeated coil turns of a coil, as described with respect to other embodiments set forth herein. Particularly, the embodiments in FIGS. 6A–6D are designed for utilization with a planar dielectric window to couple energy into a plasma. Inductive elements of FIGS. 6A–6D each comprise a plurality of identical, repeated conductor segments which are positioned in a circular pattern around the center of the inductive element. Several of the elements, such as those is FIGS. 6A, 6C, and 6D have repeated conductor segments which are disposed to extend radially outwardly from the center of the inductive element. Such inductive elements produce ring-shaped plasmas inside a processing chamber and may be utilized with other additional hardware which might be positioned proximate the center of such inductive elements. For example, a magnetron device, gas injection assembly, measuring devices and other processing hardware might be positioned in the center of the inductive elements of FIGS. 6A–6D for a plasma process. The elements illustrated in FIGS. 6A–6D are somewhat distinct from the traditional wound coils or antennas which include a plurality of adjacent concentric coil turns. While several of the embodiments utilize multiple layers, such as the inductive element in FIGS. 6B, and while the inductive element of FIG. 6B utilizes repeated segments in the form of coil turns arranged in a generally circular pattern, inductive elements in FIGS. 6A–6D, as compared to a tradition al wound or spiral coil antenna, will generally have a reduced input impedance at the ends of the antenna. Furthermore, the inductive elements of FIGS. 6A–6D may have a lower inductance as compared with a traditional coil design.

Referring to FIG. 6A, an inductive element 80 is shown which is configured for being oriented in a plane generally parallel to the horizontal plane of a dielectric window (see FIG. 1D). The inductive element 80 forms a plurality of repeated segments 82 which are disposed to extend radially outwardly from a center 84 of the inductive element. Each of the repeated segments 82 contribute to the production of a plasma, and since the segments are arranged radially around center 84, a circular or ring-shaped plasma is created with such an element. Inductive element 80 has repeated conductor segments 82 which include outer portions 86 which are predominantly circular in shape as illustrated by reference circles 87. In accordance with the principles of the present invention, inductive element 80 creates a dense, uniform ring-shaped plasma which may be utilized in combination with other processing components, such as magnetrons, gas-injection assemblies, or measuring devices which may be positioned proximate the center 84 of the inductive element, since the plasma generation is predominantly maintained radially outward from the center proximate the repeated segments 86. Inductive element 80 includes a crossover segment 88 which extends generally through the center 84 of the inductive element such that generally one side of the inductive element conducts current in one direction, such as clockwise direction, wherein the other side of the inductive element will conduct current in an opposite direction, such as a counterclockwise direction. In that way, a more consistent plasma density is achieved within the ring-shaped plasma. RF power is coupled to element 80 at terminals 81.

Figure 6B:
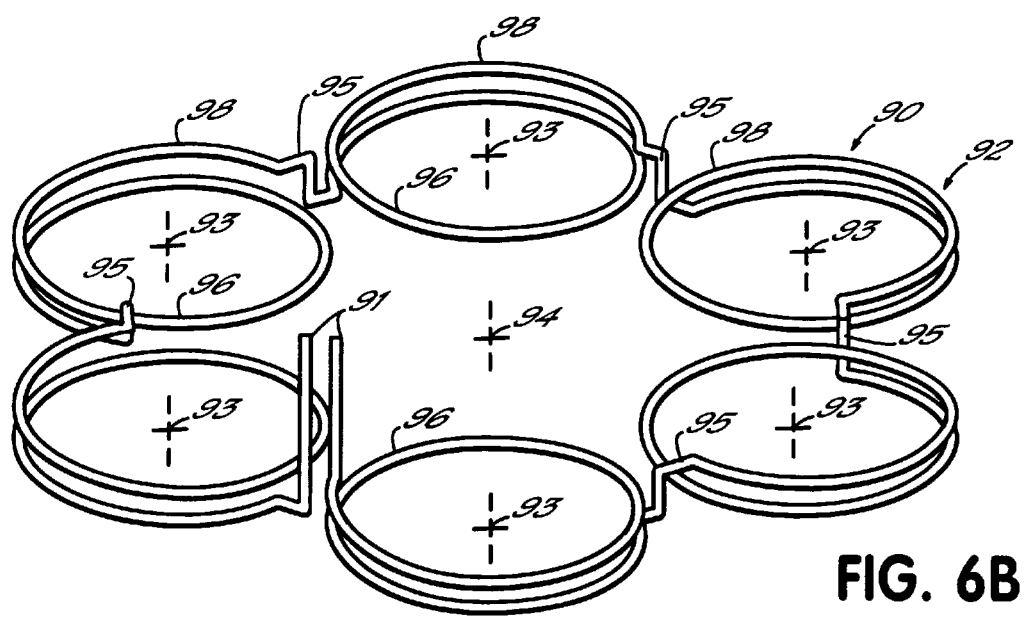
FIG. 6B is a perspective view of an alternative embodiment of a generally planar inductive element in accordance with the principles of the present invention.

FIG. 6B illustrates an inductive element 90 which is also configured for being oriented in a plane generally parallel to a planar dielectric window (see FIG. 1D), and includes repeated conductor segments 92 which form individual coils. While the segments 92 form coils, the repeated conductor segments are not arranged in a coil fashion. That is, the individual coils 92 are not simply coil turns of a larger coil structure. Each of the coils 92 includes approximately one-and-one-half coil turns and are arranged in a generally circular pattern around a center 94 of the inductive element. The embodiment in FIG. 6B has coils which are helical in shape. Each of the coil segments 92 is wound around an axis 93 which is generally vertical, such that the one-and-a-half turns of each repeated coil segment 92 provide a multiple-layer inductive element with segments located in vertically spaced, but horizontally-oriented planes, as illustrated in FIG. 6B. Each of the coil segments include transition segments 95 positioned between the various coil segments 92 such that each coil segment may be similarly wound between a lower portion 96 and an upper portion 98. Each coil segment 92 is similarly arranged around the center 94 of the inductive element 90. RF power is coupled to the element 90 at terminals 91.

Figure 6C:
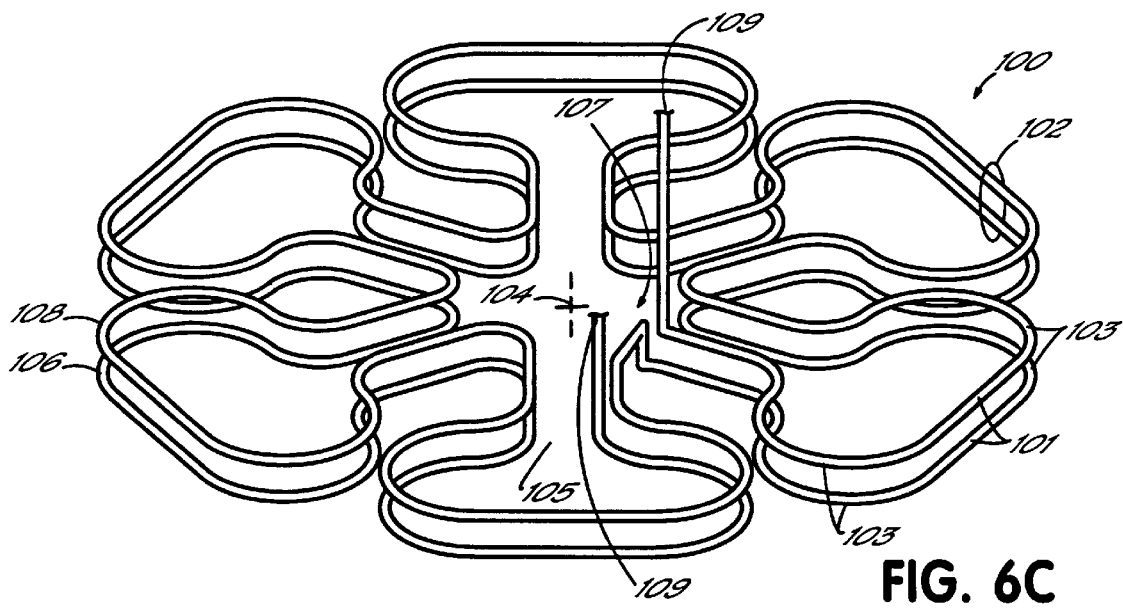
FIG. 6C is a perspective view of an alternative embodiment of a generally planar inductive element in accordance with the principles of the present invention.
Figure 6D:
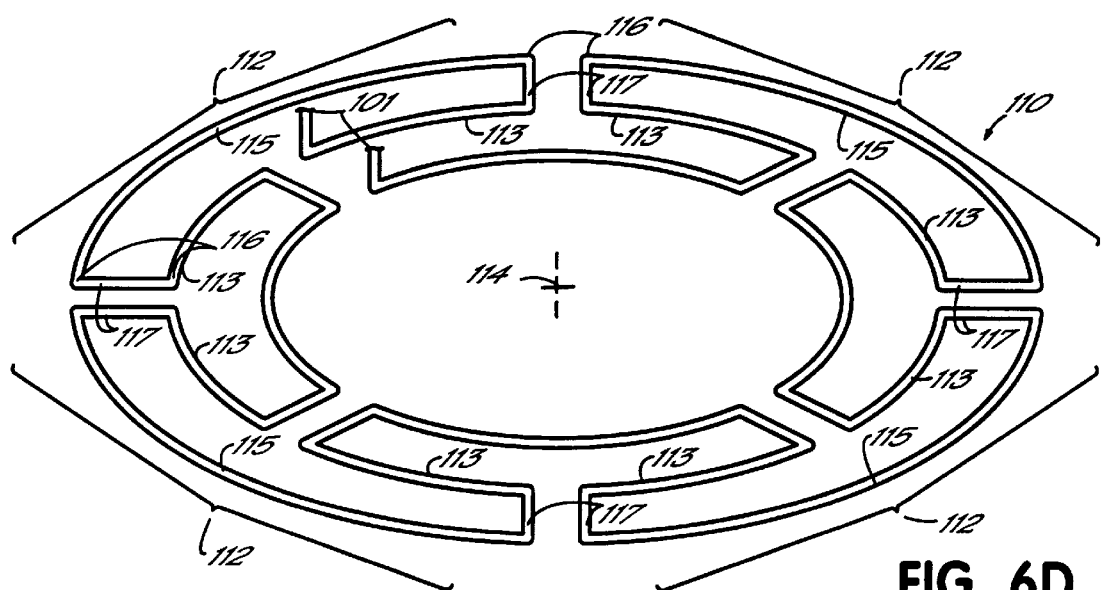
FIG. 6D is a perspective view of an alternative embodiment of a generally planar inductive element in accordance with the principles of the present invention.

The inductive element 100 of FIG. 6C is also configured for being oriented in a horizontal plane generally parallel to a planar dielectric window and forms repeated conductor segments 102 disposed to extend radially outwardly from the center 104 of the inductive element. The repeated segments 102 include generally oval-shaped portions each having a generally linear outer side 101 and rounded or radiused ends 103. Inductive element 100 also has multiple levels or layers similar to the inductive element illustrated in FIG. 6B. However, the multiple layers, which exist as a first layer indicated by reference numeral 106 and a second layer indicated by reference numeral 108 are formed by repeating a pattern in two, vertically-spaced, horizontal planes. More specifically, inductive element 100 forms a plurality of repeated conductor segments in the first layer 106 originating at approximately point 105. At approximately point 107, transition occurs in which the conductor used to form the inductive element 100 extends vertically up to level 108 and then repeats the pattern, forming repeated segments which overlie or are coextensive with the repeated segments in the lower layer 106. RF power is coupled to the element 100 at terminals 109

FIG. 6D illustrates still another alternative design for an inductive element for use in a plasma processing system in accordance with the principles of the present invention. Inductive element 110 is configured to be oriented in a horizontal plane generally parallel to a dielectric window and forms repeated segments 112 which extend radially outwardly from a center 114 of the inductive element 110. Segments 112 are oriented in a similar fashion to the segments 102 illustrated in FIG. 6C. However, inductive element 110 only utilizes a single level or layer, and the repeated segments 112 take a different form. Rather than forming oval-shaped portions as illustrated in FIG. 6C, the repeated segments have numerous angled corners 116, generally in the form of what might be considered a rounded rectangle which is formed to have a radius with respect to the center 114 of the inductive element 110. The rounded rectangles include curved inner sides 113 and curved outer sides 115 connected by radially oriented segments 117. RF power is coupled to the element at terminals 101.

In accordance with another aspect of the present invention, an inductive electrical element might be configured and utilized to couple electrical energy into a process space of a processing chamber, both through a sidewall portion of the processing chamber as well as simultaneously through an end wall portion of the processing chamber. Conventionally, a typical dielectric window is positioned at an end of the chamber or proximate an end wall of the chamber, usually at the top end of the chamber, as shown in FIG. 1D. In that way, electrical energy from a conventional planar coil antenna is directed downwardly into the process space of the chamber. Alternatively, the sidewall of the chamber might be formed of a dielectric material and a helical or solenoidal coil might be wound around the sidewall to couple energy into the chamber. In accordance with the another aspect of the present invention, a generally non-planar inductive element having multiple coil turns is configured such that segments of the coil turns are positioned or oriented along sidewall portions of the chamber and also simultaneously along end wall portions of the chamber. Electrical energy from the inductive element is thereby coupled simultaneously through both the sidewall and end wall portions. That is, in one embodiment, inductive electrical energy is coupled into a plasma from the sides as well as from the top of the chamber. To that end, a processing system utilizing such an inductive element has a sidewall portion and an endwall portion formed of a dielectric material, such as quartz.

Figure 7A:
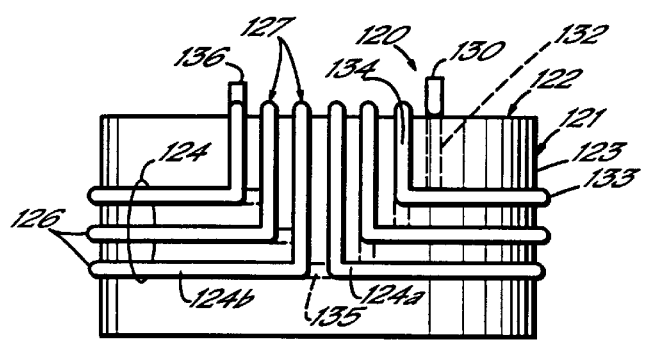
FIG. 7A is a side view of an embodiment of an inductive element in the present invention utilized for coupling electrical energy into a processing chamber from the sides and end thereof.
Figure 7B:
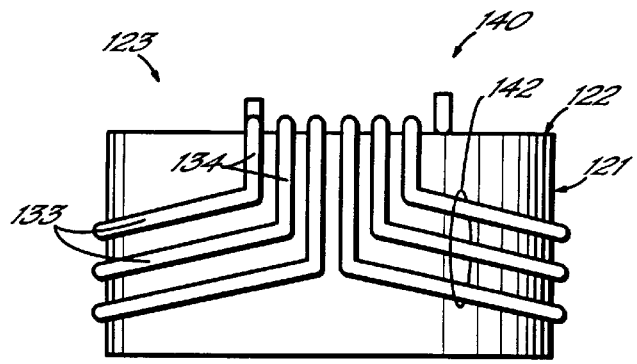
FIG. 7B is a side view of an embodiment of an alternative inductive element in the present invention utilized for coupling electrical energy into a processing chamber from the sides and end thereof.
Figure 7C:
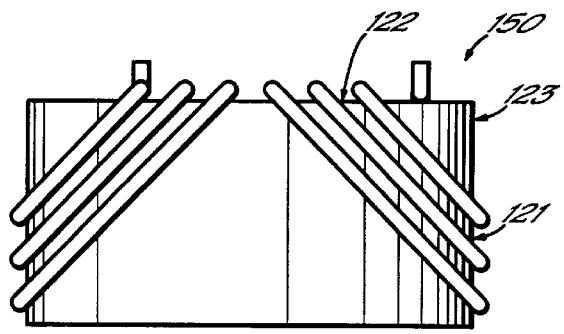
FIG. 7C is a side view of an embodiment of an alternative inductive element in the present invention utilized for coupling electrical energy into a processing chamber from the sides and end thereof.
Figure 7D:
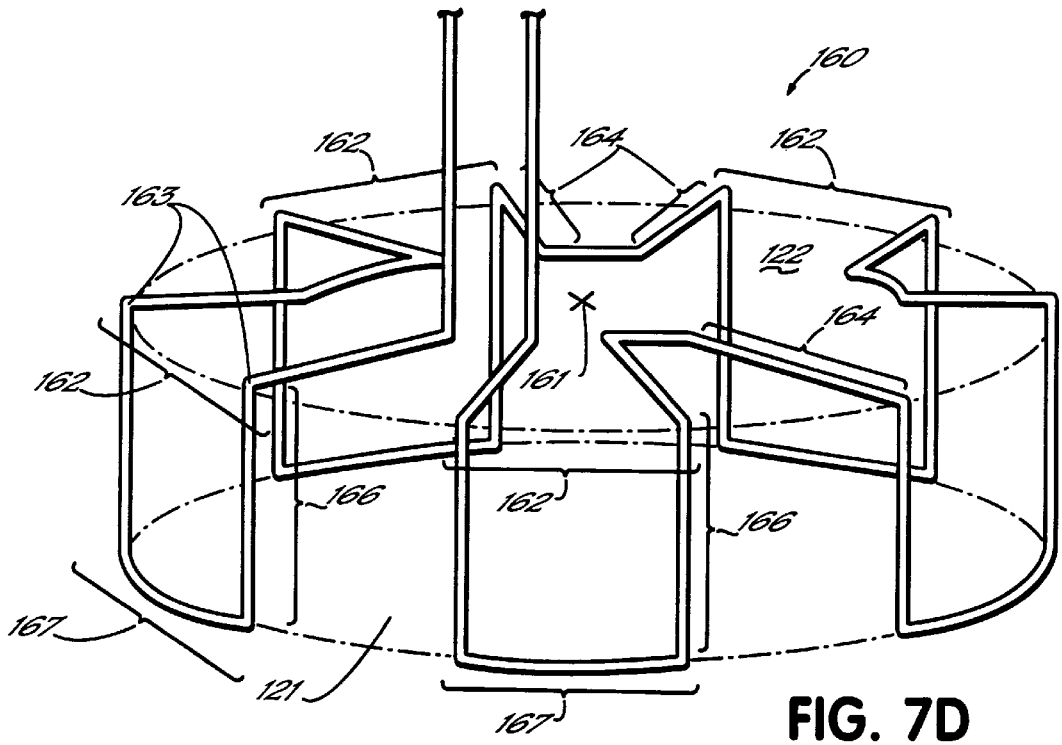
FIG. 7D is a schematic perspective view of an embodiment of an alternative inductive element in the present invention utilized for coupling electrical energy into a processing chamber from the sides and end thereof.

Referring to FIG. 7A, an inductive element 120 in the form of a coil is shown formed and configured around a section 123 of a processing chamber which includes a sidewall portion 121, and an end wall portion 122. The processing chamber section 123 may be incorporated into a larger chamber, such as that shown in FIG. 8B. The section 123 will generally be positioned opposite the substrate to be processed to form a plasma proximate that substrate. Although the section 123 illustrated in FIGS. 7A–7C is shown to be generally cylindrical with a generally flat end wall portion 122 and cylindrical sidewall portion 121, the section may take other shapes as well, such as the somewhat conical shape shown in FIG. 8B. The inductive element 120 is formed as a coil to include multiple coil turns indicated collectively by reference numeral 124, wherein each of the turns includes a segment 126 which is oriented generally along and around the chamber sidewall portion 121. The coil turns 124 also include segments 127 oriented along the endwall portion 122. In that way, the coil turns 124 of the inductive element 120 couple energy into the plasma, both through a sidewall portion and an endwall portion of the chamber. The sidewall and endwall portions 121, 122 are formed of a suitable dielectric material, such as quartz, for allowing electrical energy to be coupled therethrough to the plasma.

The coil turns 124 are wound and arranged around the dielectric chamber section 123 to couple energy into the plasma from generally all sides of section 123. That is, the element 120 includes segments of the coil turns which are oriented generally along the chamber sidewall portion 121 and segments of the coil turns which are oriented along the chamber end wall portion 122. To that end, the inductive element 120, coupled to a terminal of an RF power supply at end 130, includes coil turns wherein each turn has a segment which winds across the endwall portion and a segment which winds around the sidewall portion 122. The sidewall segments of the coil turns include sections which are oriented at angles to each other. Specifically, the sidewall segments of the coil turns, which are positioned along the sidewall portion 121, each includes a section 132 running down the sidewall portion, and a section which runs around the sidewall portion 121, as indicated by horizontal section 133. The sidewall segment of each coil turn further includes a section that extends back up over the sidewall portion 121, as indicated by vertical section 134. The coil turns then extend back over across the endwall portion 122. As illustrated in FIG. 7A, that pattern is repeated for the various coil turns 124, progressing down one side of the chamber section 123. At lower coil 124a, the transition is made at segment 135 over to the coil turn 124b which then winds around and up the sidewall portion 121, over the endwall portion 122, and repeats along the other side of chamber section 123 until it terminates in end 136, which couples to the other terminal of an RF power supply. As illustrated in the figures, the coil 120 basically has sets of coil turns wherein one set of turns is positioned generally along one side of the chamber and another set of turns is positioned generally along another side of the chamber.

In the embodiment of the element shown in FIG. 7A, the coil turn segments along the sidewall portion include sharp 90 degree bends as shown in FIG. 7A. The various coil turn sections winding up and down the sidewall portion 122, indicated by reference numerals 132, 134 are oriented in a generally vertical orientation. Other sections of the inductive element, including sections 133, are generally horizontally oriented. There is an approximately 90° bend between the coil turn sections 132,134 and section 133. Alternatively, other orientations might be utilized for the various sections of the coil turns.

Referring to FIG. 7B, for example, an alternative embodiment of an inductive element generally similar to inductive element 120 is shown. Inductive element 140 includes a plurality of coil turns 142 which extend around sidewall portion 121 and over end wall portion 122 of a processing chamber section 123 similar to the inductive element 120 of FIG. 7A. However, the transition between the sections 134 of the coil turns 142 and the sections 133, is at an angle greater than 90°, such that the individual sections 134, 133 are generally not perpendicular to each other. The angle between the sidewall sections 133, 134 might be varied to accommodate a particular shape of the chamber section 123. For example, the angle might be less than 90°. Element 140 couples energy into a plasma through both the end wall and sidewall of a chamber.

FIG. 7C illustrates another alternative embodiment of an inductive element utilized to couple electrical energy into a processing chamber from endwall and sidewall portions of the chamber. The embodiment in FIG. 7C does not utilize coil turns having multiple angled sections formed therein as shown in FIGS. 7A, 7B. Inductive element 150 utilizes generally circular wound coil turns which are wound such that sections of the turns are around the chamber section 123 and sections of the turns are simultaneously across the endwall portion 122 and across the sidewall portion 121. As described above, the element forms two sets of coil turns with sets positioned on opposite sides of the section 123.

The inductive elements 120, 140, 150 of FIGS. 7A, 7B, and 7C, respectively, may be used to inductively couple electrical energy into a plasma from various angles, and may be utilized to vary the penetration of electrical energy into the plasma. Thereby, the inductive elements affect the stability and uniformity of the plasma in a way not achievable with planar coils. For example, with planar coils, there is generally little ability to affect the size of coupling interface between coil and plasma, and thus enlarge the area where RF power is deposited into a plasma. Generally, the ICP power is deposited into a plasma layer interfacing the antenna and extending a few skin depths from the dielectric window. The antenna designs as illustrated in FIGS. 7A–7C create variability by varying the orientation of the segments of the coil turns which are oriented along a sidewall portion 121 of the processing chamber so that energy is not only directed into the plasma from the top of the chamber, but also from the sides.

FIG. 7D illustrates another embodiment of a non-planar inductive element which might be utilized to inductively couple energy into a plasma through endwall and sidewall portions of a processing chamber in accordance with the principles of the invention. Inductive element 160 does not utilize repeated wound coil turns similar to the inductive elements illustrated in FIGS. 7A–7C. Rather, inductive element 160 is a variation of the inductive elements illustrated in 6A–6D wherein the repeated segments of the inductive element are arranged in a non-coil fashion and radially arranged in a circular pattern around a center axis. The segments are disposed to extend radially outwardly from a center of the inductive element. However, element 160 is not configured to be generally flat or planar as illustrated in FIGS. 6A–6D, but rather element 160 has segments oriented along a top of a chamber and segments oriented to lie along a side of a chamber.

More specifically, each of the repeated segments 162 which are arranged radially around center axis 161 are bent at corners 163 to form generally horizontal top segments 164 and generally vertical segments 166. The top segments 164 are generally oriented along the end wall or top wall portion 122 of the processing chamber, while the vertical segments 166 are generally oriented along the sidewall portion 121 of the processing chamber. For example, an inductive element similar to element 160 might be formed by bending various of the repeated segments in element 80 of FIG. 6A in a manner as shown in FIG. 7D. Each of side segments 166 includes a section 167 which is generally horizontally oriented, but is positioned along the sidewall portion 121. Element 160 couples electrical energy into a processing chamber from above the chamber and through the sides of the chamber.

In accordance with one aspect of the present invention, the ICP systems and inductive elements disclosed herein may be utilized for plasma etching or plasma enhanced CVD (PECVD). In accordance with another aspect of the present invention, the inductively coupled plasma might be utilized for a sputter deposition process or sputter etching processes. In a still further aspect of the invention, the inductive elements disclosed herein might be utilized for sputter deposition in combination with a second, independently biased inductive element, for further affecting a plasma within a processing chamber or for ionizing sputtered particles.

Figure 8A:
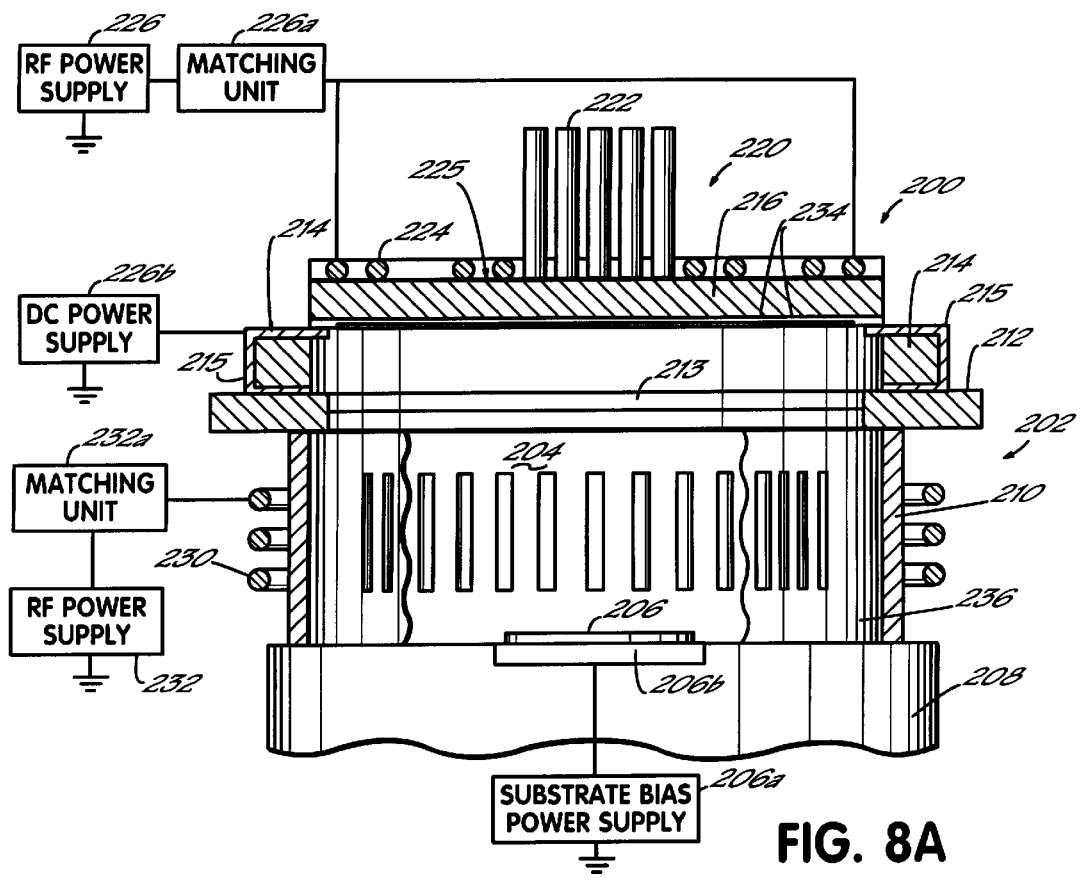
FIG. 8A is a side schematic and partially broken view of a sputter deposition processing system in accordance with the principles of the present invention.

To that end, FIG. 8A illustrates a processing system 200 which utilizes a processing chamber 202 to define a process space 204 which holds a substrate 206 to be processed. System 200 utilizes inductive elements as set forth hereinabove in accordance with the principles of the invention and is particularly suited for an ionized PVD method in which particles sputtered from a target are ionized prior to deposition on a substrate. Substrate 206 sits upon a wafer support 208 positioned beneath a dielectric chamber section 210 which surrounds the substrate 206 and processing space 204. Support 208 includes the substrate holder 206b that may be biased with a suitable power supply 206a. An aperture plate 212 and a sputter deposition target 214 and associated mount 215 are positioned on top of dielectric chamber section 210. The aperture plate 212 includes an aperture or opening 213 therein, and the target 214, which may be in the form of a ring target, surrounds the aperture 213. Target 214 is coupled to a suitable DC power supply 226b. The dielectric window 216 is positioned on top of the aperture plate 212 and target 214. Inductive element 220 is positioned on top of the dielectric window 216.

In accordance with the principles of the present invention, inductive element 220 may be any one of a number of suitably configured inductive elements which are operable in conjunction with a planar dielectric window, such as the inductive element 10 illustrated in FIG. 1A and shown in FIG. 8A. Faraday shields 234, 236 might be utilized in system 200 as discussed with respect to the system of FIG. 1D. Inductive element 10 includes vertical coil turns 222 and horizontal coil turns 224. The horizontal coil turns 224 are generally located in a plane parallel to a planar top surface 225 of dielectric window 216. Inductive element 220 couples electrical energy into processing space 204 and specifically couples energy into a plasma in the processing space 204 through window 216. The plasma is utilized to sputter material from the target 214 and to ionize the sputtered atoms of target material, which is then deposited upon substrate 206 according to known ionized sputter deposition techniques Inductive element 220 is coupled to an RF power supply 226 through the matching unit 226a. Target 214 is coupled to a DC power supply 226b for biasing the target. While inductive element 220, shown in FIG. 8A, is similar in design to the inductive element illustrated in FIGS. 1A and 1B, other inductive elements in accordance with the principles of the present invention may also be utilized in system 200 in conjunction with a planar dielectric window 216. For example, the inductive elements illustrated in FIGS. 1C, 2A–2B, 3A–3B, 4, 5A–5B, and 6A–6D might also be utilized proximate the planar window 216.

To further control and affect a plasma formed in the processing chamber space 204 in accordance with an aspect of the invention, a secondary inductive element 230 is positioned around the dielectric chamber section 210. To that end, the secondary inductive element 230 may be in the form of a cylindrical coil element wound around section 210, as shown in FIG. 8A. Inductive element 230 is coupled to an RF power supply 232, through the matching unit 232a. Supply 232 operates independently of the RF power supply 226. In that way, a primary inductive element 220 and a secondary inductive element 230 are independently biased and operated. The two independent RF power supplies, 226, 232 may be utilized for adjusting the amount of power delivered into the plasma.

One specific advantage of the inventive system 200 which utilizes two independently biased inductive elements is realized with an ionized PVD process. In an ionized PVD (iPVD) process, such as an ionized metal PVD process, metal particles (e.g. Al particles) are sputtered from a target utilizing the plasma generated and sustained by the primary elements, and, after sputtering, the particles are ionized by the secondary plasma. An ionized PVD process allows deposition of metal films onto substrates utilizing features which have high aspect ratios. Maximizing the electron temperature and electron density in the plasma is an important issue for optimizing the ionization of the metal particles in an iPVD process. What often occurs in an iPVD process, however, is that the increased density of metal particles that exist within the primary plasma quenches or reduces the electron temperature within the primary plasma, which thereby reduces the overall metal ionization that may be achieved. Furthermore, energy associated with the sputtered metal particles is often absorbed by the process gas, such as argon, which results in a reduction in the density or a rarefaction of the argon process gas. The rarefaction of the argon gas, in turn, reduces the thermalization effectiveness of sputtered atoms and thereby further reduces the ionization of the metal.

Utilizing a system, as illustrated in FIG. 8A and in accordance with the principles of the present invention, metal atoms will interact with high density plasmas in two different regions of the process space, as defined by the inductively coupled energy from the separate inductive elements 220 and 230. In accordance with the principles of the invention as discussed above, the primary inductive element 220 provides a high density and uniform plasma proximate the targets 214. The material to be deposited on the substrate 206 is sputtered from the target 214 and is ionized by the primary plasma. Some fraction of the sputtered material transits the primary plasma region without completely cooling to the local gas temperature and will thus not have a chance to collide with plasma particles and become ionized. The secondary inductive element 230 significantly enhances the ionization of the sputtered material because the sputtered atoms have a chance to cool to a thermal state by the time they reach the secondary plasma, and are thus able to collide with plasma particles to be ionized. Furthermore, any fraction of formerly ionized sputtered atoms which have recombined with electrons of the plasma to a neutral state are again ionized by the secondary plasma. This reionization will occur in the area of the process space proximate inductive element 230, that is, the space directly above the substrate 206. The secondary inductive element 230 provides energy to a plasma in the processing chamber 202 independently of the effects of the primary inductive element 220. In that way, a greater amount of energy is delivered to the plasma and metal particles sputtered from the target 214, which thus increases the desired ionization of the metal particles and increases the uniformity of the ionized metal flux. Furthermore, the secondary inductive element 230 adds RF energy to the outer circumference of the plasma field where a significant amount of the ionized metal flux is lost due to recombination and sidewall adsorption associated with dielectric chamber section 210. In one embodiment of the invention, the primary inductive element may be coupled to an RF power supply 226 operating at approximately 13.56 MHZ, while the secondary RF power supply 232 may operate at approximately 2 MHZ. The power supplies 226, 232 operate independently. Generally, the inductive elements may be powered by supplies within the range of excitation frequencies from 400 kHz up to 100 MHZ. The RF power supplies are coupled to the inductive elements through matching units 226a, 232a to deliver maximum RF power into the plasma.

A plasma created utilizing two inductive elements, as illustrated in FIG. 8A may be more appropriately controlled over a wider range of target power and gas pressure parameters, due to power being delivered to the plasma from two independent energy sources. Furthermore, the system 200 illustrated in FIG. 8A will increase the size of the region of metal particle ionization by providing independent control of the plasma in the region directly above the substrate 206, and therefore, independent control of the plasma's interaction with particles sputtered from target 214. Furthermore, the inventor has determined that a system similar to system 200 may also utilize other physical mechanisms for introducing electrical energy into the plasma, such as ion acoustic waves, electron plasma waves, and other wave coupling mechanisms. Furthermore, another advantage to the inventive system as discussed herein is that total power delivered into the plasma may be split into two portions providing for higher cumulative power levels delivered to the plasma. Additionally, splitting the power requirement between primary and secondary inductive elements reduces heating of those elements and makes cooling of the elements easier.

The system 200 may also be used to enhance spatial ionization efficiency of particles sputtered from target 214. The size of the central opening 213 in the aperture plate 212 will restrict the sputtered atoms that strike the substrate before they cool down and are ionized. The size of the central opening might be varied to reflect a greater or lesser amount of sputtered particles back into the plasma from primary element 220 to be ionized. This enhances the ionization probability for the sputtered particles before they strike the substrate surface. The system in FIG. 8A makes the ionization process more independent of gas pressure within the processing space 204 and more independent of the amount of energy delivered to the target 214 to sputter particles therefrom. Thereby, the overall "process window" of the system is enhanced, which is a significant advantage over prior art systems using single, planar inductive elements which are limited to certain process gas pressure ranges and power constraints.

For further enhancing the inductive coupling of energy into the gas plasma, as discussed above, system 200 may utilize Faraday shields in the form of slotted shield 234 proximate an inner side of the dielectric window 216, and shield 236 surrounding chamber portion 210 proximate the secondary inductive element 230. Faraday shields are useful in ionized PVD systems which utilize metallic material that can be built up on the dielectric surfaces inside the chamber and cause an electrical short between interior parts and the plasma. Faraday shields also enhance inductive coupling of energy from element 230 into the plasma. The Faraday shields will generally be grounded and operate in accordance with known plasma principles to reduce capacitive electrical fields created by the inductive elements 220, 230, as discussed above.

Figure 8B:
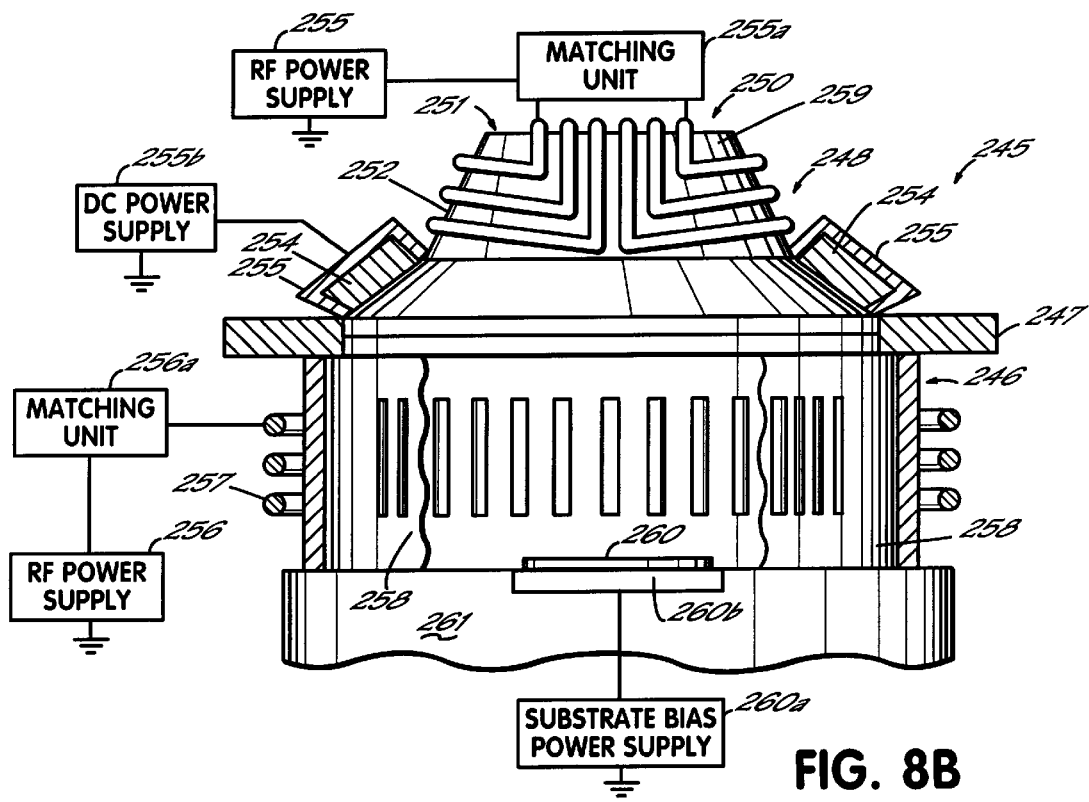
FIG. 8B is a side schematic and partially broken view of a sputter deposition processing system in accordance with the principles of the present invention.

FIG. 8B illustrates an alternative embodiment of the inventive system, similar to system 200, utilizing a primary non-planar inductive element as discussed above, and a secondary inductive element. System 245 utilizes a primary inductive element 250, similar to an element described hereinabove with respect to FIGS. 7A–7D, which couples electrical energy into the processing chamber 246, both from an endwall portion 251 and a sidewall portion 252 of the chamber. To that end, above the aperture plate 247, a dielectric chamber section 248 having an end wall portion 251 and a sidewall portion 252 is utilized instead of a flat dielectric window as shown in FIG. 8A. A ring-shaped target 254 and mount 255 is positioned around the chamber section 248 and the inductive element 250 is wound around chamber section 248 to inductively couple energy into the chamber 246 proximate target 254 and thereby sputter material particles from the target in accordance with well known plasma principles. Target 254 is coupled to a DC power supply 255b for biasing the target. An inductive element similar in shape to the element disclosed in FIG. 7B is shown in FIG. 8B. However, other similarly designed inductive elements in accordance with the principles of the present invention might be utilized. For example, inductive elements illustrated in FIGS. 7A, 7C, and 7D might also be utilized with the system 245 illustrated in FIG. 8B. Inductive element 250 is operably coupled to a matching unit 255a and RF power supply 255 which operates independently of another RF power supply 256 and matching unit 256a coupled to the secondary inductive element 257. A Faraday shield 258 is shown in system 245 and may be utilized for improving the inductive coupling of energy into chamber 246 by the secondary inductive element 257 for processing a substrate 260 positioned within chamber 246 on a support 261. Support 261 includes the substrate holder 260b, which may be biased from supply 260a to control the process voltage and parameters on the substrate 260.

Utilizing a plasma processing system similar to system 245 illustrated in FIG. 8B, the design of the processing chamber might be modified by mounting the target 254 in an area of the dielectric chamber section 248 between the individual coil turns of the inductive element 250. Referring to FIG. 8B, a target 254 might be positioned in the area designated by numeral 259 between the adjacent coil turns of inductive element 250.

Figure 8C:
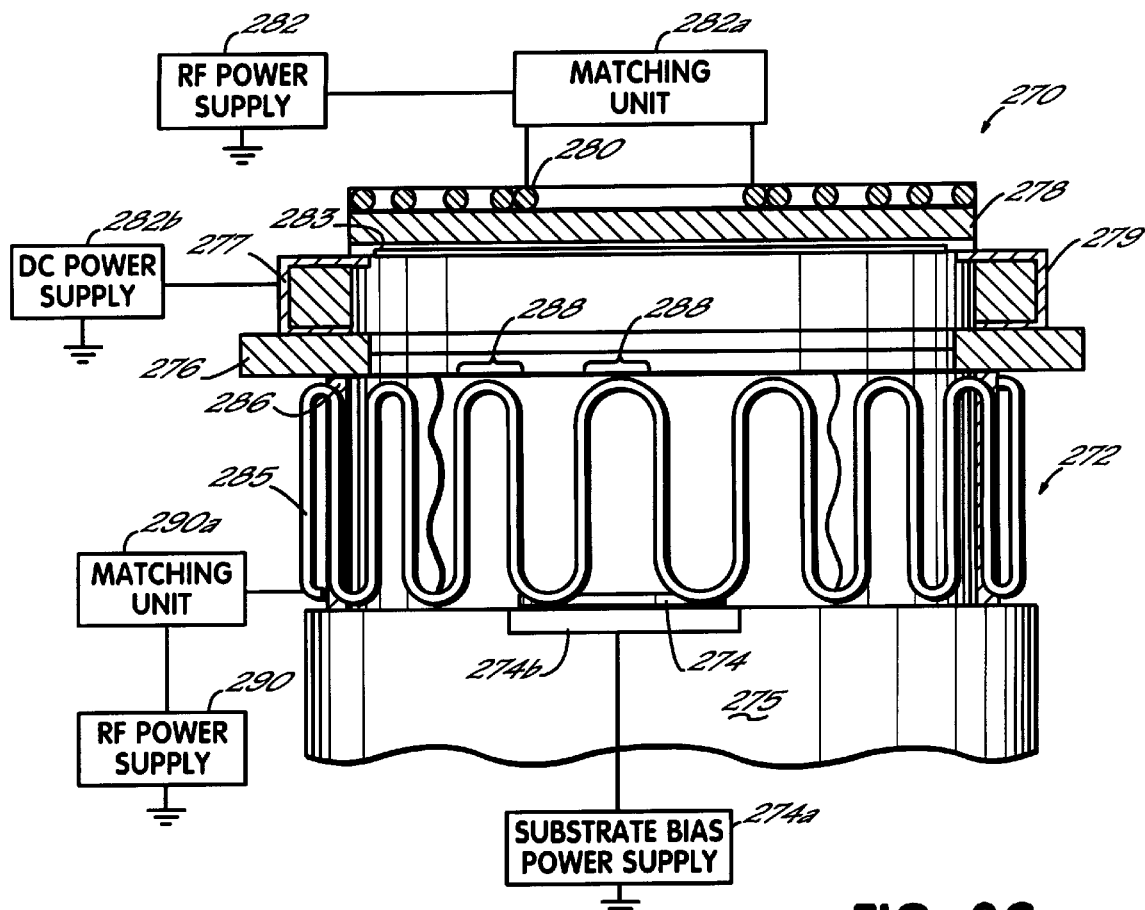
FIG. 8C is a side schematic and partially broken view of a sputter deposition processing system in accordance with the principles of the present invention.

FIG. 8C illustrates another system 270 which utilizes primary and secondary inductive elements in accordance with the principles of the present invention. System 270 uses a generally planar primary inductive element 280, such as, for example, any of the elements illustrated in FIGS. 4, 5A–5B, and 6A–6D. System 270 utilizes chamber 272 in which a substrate 274 is supported by support 275. Support 275 includes the substrate holder 274b which may be biased by supply 274a to control the voltage and process parameters on the substrate 274. Above an aperture plate 276, a target 277, mount 279, and dielectric window 278 are positioned for sputter deposition of a material layer onto substrate 274. A DC power supply 282b biases target 277. An inductive element 280 is coupled against one side of the planar dielectric window 278 for providing electrical energy to a plasma within chamber 272. Inductive element 280 is coupled to an RF power supply 282 through matching unit 282a. A Faraday shield 283 might be utilized on an inner side of dielectric window 278 for enhancing the inductive coupling of electrical energy from element 280, as discussed above.

The secondary inductive element 285 utilized around the chamber dielectric section 286 is not in the form of a cylindrical coil wound therearound, as illustrated in FIGS. 8A and 8B. Alternatively, the element 285 is formed to include a plurality of repeated, side-by-side segments 288 which are oriented vertically against the outside wall of chamber portion 286. The repeated segments 288 are generally vertically oriented, as illustrated in FIG. 8C to form an overall cylindrically shaped element around the chamber 272. Inductive element 285 is coupled to an appropriate RF power supply 290 through matching unit 290a for inductively coupling energy into the processing chamber 272 in accordance with the principles of the invention. In one preferred embodiment of the invention, the repeated segments 288 are U-shaped, as illustrated in FIG. 8C. However, other shapes of the repeated segment might be utilized. Furthermore, a cylindrical coil as shown in FIGS. 8A, 8B might also be utilized in System 270 in accordance with the principles of the invention.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A processing system for processing a substrate with a plasma, the system comprising:

a processing chamber defining a processing space and including a substrate support therein for supporting a substrate in the processing space;

a gas inlet for introducing a process gas into said processing space;

a plasma source operable for creating a plasma in the processing space from process gas introduced therein, the plasma source comprising:

a dielectric window having a generally planar surface, the dielectric window interfacing with the processing chamber proximate the processing space;

an inductive element positioned outside of the chamber and proximate the dielectric window, the inductive element operable for coupling electrical energy through the dielectric window and into the processing space to create a plasma therein;

the inductive element comprising a coil having multiple coil turns disposed successively along the length of the coil, at least one of said coil turns being oriented in a first plane, at least one of said coil turns being oriented in a second plane which is angled from the first plane.

2. The processing system of claim 1 wherein said first plane is oriented generally parallel to the planar surface of the dielectric window.

3. The processing system of claim 1 wherein said inductive element comprises another coil turn oriented in the first plane, the coil turn in the second plane being positioned generally between the coil turns in the first plane.

4. The processing system of claim 1 wherein said inductive element includes multiple coil turns oriented in the first plane.

5. The processing system of claim 1 wherein said inductive element includes multiple coil turns oriented in a plane which is angled from the first plane.

6. The processing system of claim 1 wherein at least one of said coil turns has a semicircular shape.

7. The processing system of claim 1 wherein at least one of said coil turns has a rectangular shape.

8. The processing system of claim 1 further comprising at least one coil turn oriented in a third plane angled between the first and second planes.

9. The processing system of claim 1 wherein said coil turn in the first plane which defines an inner coil end and an outer coil end, the coil turn in the second plane coupled to the outer coil end of the first plane coil turn.

10. The processing system of claim 1 wherein said coil turn in the first plane defines an inner coil end and an outer coil end, the coil turn in the second plane coupled to the inner coil end of the first plane coil turn.

11. The processing system of claim 1 wherein the inductive element further comprises a coil turn having a portion thereof oriented in the first plane and a portion thereof oriented in the second plane.

12. The processing system of claim 1 wherein said second plane is oriented to be generally perpendicular to the first plane.

13. The processing system of claim 1 wherein said processing chamber has a sidewall section formed of a dielectric material, the processing system further comprising:
a second inductive element positioned proximate the sidewall section for further coupling electrical energy into the processing space through the sidewall section.

14. The processing system of claim 13 wherein said second inductive element comprises a coil wrapped around the chamber sidewall section.

15. The processing system of claim 13 wherein the first and second inductive elements are each coupled to an electrical energy source for coupling electrical energy into the processing space, the electrical energy sources being independently operable from one another for independently biasing the first and second inductive elements.

16. The processing system of claim 13 further comprising a Faraday shield positioned between said second inductive element and the processing space.

17. The processing system of claim 1 further comprising a Faraday shield positioned between the inductive element and the processing space.

18. The processing system of claim 1 further comprising a mount in the processing chamber configured for holding a target of material.

19. A processing system for processing a substrate with a plasma, the system comprising:

a processing chamber defining a processing space and including a substrate support therein for supporting a substrate in the processing space;

a gas inlet for introducing a process gas into said processing space;

a plasma source operable for creating a plasma in the processing space from process gas introduced therein, the plasma source comprising:

a dielectric window having a planar surface, the dielectric window interfacing with the processing chamber proximate the processing space;

an inductive element positioned outside of the chamber and proximate the dielectric window, the inductive element operable for coupling electrical energy through the window and into the processing space to create a plasma therein;

the inductive element comprising a coil having multiple coil turns, each coil turn comprising a predominant arcuate portion coupled to a linear portion, the predominant arcuate portions of first and second coil turns of the inductive element being oriented in spaced and generally parallel planes to form stacked coil turns, the stacked coil turns oriented generally parallel to said dielectric window planar surface.

20. The processing system of claim 19 wherein the inductive element comprises multiple sets of stacked coil turns.

21. The processing system of claim 19 wherein said processing chamber has a sidewall section formed of a dielectric material, the processing system further comprising:
a second inductive element proximate the sidewall section for further coupling electrical energy into the processing space.

22. The processing system of claim 21 wherein said second inductive element comprises a coil wrapped around the chamber sidewall section.

23. The processing system of claim 21 wherein the first and second inductive elements are each coupled to an electrical energy source for coupling electrical energy into the processing space, the electrical energy sources being independently operable from one another for independently biasing the first and second inductive elements.

24. The processing system of claim 21 further comprising a Faraday shield positioned between said second inductive element and the processing space.

25. The processing system of claim 21 further comprising a mount in the processing chamber configured for holding a target of material.

26. The processing system of claim 19 further comprising a Faraday shield positioned between the inductive element and the processing space.

27. The processing system of claim 19 wherein the inductive element further comprises a third coil turn oriented at an angle with respect to said stacked coil turns.

28. A processing system for processing a substrate with a plasma, the system comprising:

a processing chamber defining a processing space and including a substrate support therein for supporting a substrate in the processing space;

a gas inlet for introducing a process gas into said processing space;

a plasma source operable for creating a plasma in the processing space from process gas introduced threrein, the plasma source comprising:

a dielectric window having a generally planar surface, the dielectric window interfacing with the processing chamber proximate the processing space;

an inductive element positioned outside of the chamber and proximate the dielectric window, the inductive element operable for coupling electrical energy through the dielectric window and into the processing space to create a plasma therein;

the inductive element comprising a plurality of repeated conductor segments arranged in a non-coil fashion and positioned in a circular pattern around a center of the inductive element the repeated conductor segments being oriented in planes generally parallel to the planar surface of said dielectric window.

29. The processing system of claim 28 wherein the repeated conductor segments are disposed to extend radially outwardly from a center of the inductive element.

30. The processing system of claim 28 wherein the repeated conductor segments form individual coils, the coils being arranged in a circular pattern around the center of the inductive element.

31. The processing system of claim 28 wherein the chamber comprises an end wall portion and a sidewall portion, the repeated conductor segments including horizontal segments oriented along an end wall portion of the chamber and vertical segments oriented along a sidewall portion of the chamber.

32. The processing system of claim 28 wherein said processing chamber has a sidewall section formed of a dielectric material, the system further comprising:

a second inductive element positioned proximate the sidewall section for further coupling electrical energy into the processing space through the sidewall section.

33. The processing system of claim 32 wherein said second inductive element comprises a coil wrapped around the chamber sidewall section.

34. The processing system of claim 32 wherein the first and second inductive elements are each coupled to an electrical energy source for coupling electrical energy into the processing space, the electrical energy sources being independently operable from one another for independently biasing the first and second inductive elements.

35. The processing system of claim 32 further comprising a Faraday shield positioned between said second inductive element and the processing space.

36. The processing system of claim 32 further comprising a target mount in the processing chamber configured for holding a target of material.

37. The processing system of claim 28 further comprising a Faraday shield positioned between the inductive element and the processing space.

38. The processing system of claim 28 wherein the repeated conductor segments of the inductive element form a first layer of the element, the inductive element further comprising an additional layer of repeated conductor segments.

39. The processing system of claim 38 wherein said layers are generally co-extensive.

40. A processing system for processing a substrate with a plasma, the system comprising:

a processing chamber defining a processing space and including a substrate support therein for supporting a substrate in the processing space;

the processing chamber having a sidewall portion and an endwall portion formed of a dielectric material;

a plasma source operable for creating a plasma in the processing space from process gas introduced therein, plasma source comprising:

an inductive element positioned outside of the chamber and operable for coupling electrical energy into the processing space to create a plasma therein;

the inductive element comprising a coil having multiple coil turns, each of the turns including a segment thereof oriented along said chamber sidewall portion and a segment thereof oriented along said chamber end wall portion for coupling energy simultaneously into the processing space through both the sidewall and end wall portions of the chamber.

41. The processing chamber of claim 40 wherein said inductive element comprises a coil having sets of coil turns, one set of turns being positioned generally along on one side of the chamber and another set of turns being positioned generally along another side of the chamber.

42. The processing system of claim 40 wherein the segment of the coil turn oriented along the chamber sidewall portion includes a section oriented in a first orientation and a section oriented in a second orientation which is angled from the first orientation.

43. The processing system of claim 42 wherein the first orientation is generally perpendicular to the second orientation.

44. The processing system of claim 40 wherein said processing chamber has a sidewall section formed of a dielectric material, the chamber sidewall section being positioned below said sidewall portion and endwall portion, the system further comprising:

a second inductive element proximate the sidewall section for further coupling electrical energy into the processing space through the sidewall section.

45. The processing system of claim 44 wherein said second inductive element comprises the form of a coil wrapped around the chamber sidewall section.

46. The processing system of claim 44 wherein the first and second inductive elements are each coupled to an electrical energy source for coupling electrical energy into the processing space, the electrical energy sources being independently operable from one another for independently biasing the first and second inductive elements.

47. The system of claim 44 further comprising a Faraday shield positioned between said second inductive element and the processing space.

48. The system of claim 40 further comprising a Faraday shield positioned between the inductive element and the processing space.

49. The processing system of claim 40 further comprising a mount in the processing chamber configured for holding a target of material.

50. An element for coupling electrical energy into a processing chamber to generate a plasma from a process gas in the chamber, the element comprising:

an electrically conductive element comprising a coil having multiple coil turns disposed successively along the length of the coil, at least one of the coil turns being oriented in a first plane, at least one of the coil turns being oriented in a second plane which is angled from said first plane.

51. The element of claim 50 further comprising another coil turn oriented in the first plane, the coil turn in the second plane being positioned generally between the coil turns in the first plane.

52. The element of claim 50 further comprising multiple coil turns oriented in the first plane.

53. The element of claim 50 further comprising multiple coil turns, each turn oriented in a plane generally parallel to said second plane.

54. The element of claim 50 further comprising at least one coil turn oriented in a third plane angled between the first and second planes.

55. The element of claim 50 wherein said second plane is oriented generally perpendicular to the first plane.

56. An element for coupling electrical energy into a processing chamber to generate a plasma from a process gas in the chamber, the element comprising:

an electrically conductive element comprising a coil having multiple coil turns, each coil turn comprising a predominantly arcuate portion coupled to a linear portion, the predominantly arcuate portions of first and second coil turns of the element being oriented in spaced and generally parallel planes to form stacked coil turns;

the linear portions of the first and second coil turns being substantially co-planar and located in a plane which is generally parallel to the spaced and parallel planes containing the arcuate portions of the coil turns.

57. The element of claim 56 wherein the inductive element comprises multiple sets of stacked coil turns positioned adjacent to each other.

58. An element for coupling electrical energy into a processing chamber through a dielectric window defining a plane to generate a plasma from a process gas in the chamber, the element comprising:

an electrically conductive element comprising a plurality of discrete, repeated conductor segments, the discrete, repeated segments arranged in a non-coil fashion and positioned in a circular pattern around a center wherein the circular pattern of the discrete segments leaves the center of the pattern generally open, the element configured to be oriented such that the repeated segments are oriented in planes generally parallel to the plane defined by the dielectric window.

59. The element of claim 58 wherein the repeated conductor segments are disposed to extend radially outwardly from a center of the electrically conductive element.

60. The element of claim 59 wherein the repeated conductor segments form individual coils, the coils being arranged in a circular pattern around the center of the inductive element.

61. The element of claim 59 wherein each of the individual coils are helical in shape and include approximately one and one-half coil turns.

62. The element of claim 58 wherein the repeated conductor segments of the conductive element form a first layer of the element, the conductive element further comprising an additional layer of repeated conductor segments.

63. The element of claim 62 wherein the layers are generally co-extensive.

64. An element for coupling electrical energy into a processing chamber having a sidewall portion and an end wall portion, the element operable to generate a plasma from a process gas in the chamber, the element comprising:

an electrically conductive element comprising a coil having multiple coil turns, each of the turns including a segment thereof oriented for being positioned along a chamber sidewall portion and a segment thereof oriented for being simultaneously positioned along a chamber end wall portion for coupling electrical energy into the processing space through both the sidewall and end wall portions of the chamber.

65. The element of claim 64 wherein the conductive element comprises a coil having multiple coil turns arranged in sets of coil turns, at least one set of turns being oriented generally along one side of the chamber and another set of turns being oriented along another side of the chamber.

66. The element of claim 64 wherein the segment of the coil turn oriented along the chamber sidewall portion includes a section oriented in a first orientation and a section oriented in a second orientation which is angled from the first orientation.

67. The element of claim 66 wherein the first orientation is generally perpendicular to the second orientation.

* * * * *

UNITED STATES PATENT AND TRADEMARK OFFICE
CERTIFICATE OF CORRECTION

PATENT NO. : 6,237,526 B1
DATED : May 29, 2001
INVENTOR(S) : Jozef Brcka

It is certified that error appears in the above-identified patent and that said Letters Patent is hereby corrected as shown below:

Column 2,
Line 9, reads "solenoidalshaped" and should read -- solenoidal-shaped --.

Column 5,
Line 57, reads "utilized in conjuctive" and should read -- utilized in conjunction --.

Column 6,
Line 19, reads "elements provide dense" and should read -- elements provides dense --.

Column 7,
Line 58, reads "various of the" and should read -- various designs of the --.

Column 8,
Line 52, reads "dielectric c sidewall" and should read -- dielectric sidewall --.

Column 9,
Line 60, reads "like e turn" and should read -- like turn --.

Column 10,
Lines 31 and 56, reads "cross-section" and should read -- cross section --.

Column 11,
Line 6, reads "cross-section" and should read -- cross section --.

Column 12,
Lines 22 and 23, should be in same paragraph.
Line 50, reads "to make e most" and should read -- to make most --.
Line 53, reads "rather then semicircular" and should read -- rather then semicircular --.

Column 13,
Line 36, reads "1D" and should read -- 10d --.
Line 38, reads "slop e" and should read -- slope --.

Column 14,
Line 31, reads "are s shown" and should read -- are shown --.
Line 36, reads "plane(see" and should have space between plane and parenthesis --.

Column 15,
Line 40, reads "semi-circular" and should read -- semicircular --.

UNITED STATES PATENT AND TRADEMARK OFFICE
CERTIFICATE OF CORRECTION

PATENT NO. : 6,237,526 B1
DATED : May 29, 2001
INVENTOR(S) : Jozef Brcka

It is certified that error appears in the above-identified patent and that said Letters Patent is hereby corrected as shown below:

Column 16,
Line 10, reads "FIGS. 6B" and should read -- FIG. 6B --.
Line 14, reads "tradition al" and should read -- traditional --.
Line 35, reads "gas-injection" and should read -- gas injection --.
Line 43, reads "such as clockwise" and should read -- such as a clockwise --.

Column 17,
Line 25, sentence needs a period.
Line 61, reads "with the another" and should read -- with another --.

Column 22,
Lines 23, 25 and 28, reads "MHZ" and should read -- $MH_z$ --.

Column 24,
Line 44, reads "specific details representative" and should read -- specific details, representative --.

Column 27,
Line 61, reads "endwall" and should read -- end wall --.

Column 28,
Line 24, reads "endwall" and should read -- end wall --.

Signed and Sealed this

Twenty-sixth Day of March, 2002

*Attest:*

*Attesting Officer*

JAMES E. ROGAN
*Director of the United States Patent and Trademark Office*